(12) United States Patent
Zeng et al.

(10) Patent No.: US 9,876,173 B2
(45) Date of Patent: Jan. 23, 2018

(54) ORGANIC ELECTROLUMINESCENT MATERIALS AND DEVICES

(71) Applicant: Universal Display Corporation, Ewing, NJ (US)

(72) Inventors: Lichang Zeng, Lawrenceville, NJ (US);
Walter Yeager, Yardley, PA (US);
Suman Layek, Lawrenceville, NJ (US);
Bin Ma, Plainsboro, NJ (US);
Kwang-Ohk Cheon, Holland, PA (US);
Chuanjun Xia, Lawrenceville, NJ (US)

(73) Assignee: Universal Display Corporation, Ewing, NJ (US)

(*) Notice: Subject to any disclaimer, the term of this patent is extended or adjusted under 35 U.S.C. 154(b) by 647 days.

(21) Appl. No.: 14/100,767

(22) Filed: Dec. 9, 2013

(65) Prior Publication Data
US 2015/0162538 A1 Jun. 11, 2015

(51) Int. Cl.
*H01L 51/00* (2006.01)
*H01L 51/50* (2006.01)

(52) U.S. Cl.
CPC ...... *H01L 51/0054* (2013.01); *H01L 51/0072* (2013.01); *H01L 51/0081* (2013.01); *H01L 51/0085* (2013.01); *H01L 51/5016* (2013.01)

(58) Field of Classification Search
CPC ............. H01L 51/0054; H01L 51/0072; H01L 51/0085; H01L 51/0081; H01L 51/5016
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |

(Continued)

FOREIGN PATENT DOCUMENTS

| | | |
|---|---|---|
| EP | 0650955 | 5/1995 |
| EP | 1238981 | 9/2002 |

(Continued)

OTHER PUBLICATIONS

Geffroy et al, Review, Organic Light-Emitting Diode (OLED) Technology: Materials, Devices and Display Technology, vol. 55, pp. 572-582 (2006).*

(Continued)

*Primary Examiner* — Alexander Kollias
(74) *Attorney, Agent, or Firm* — Duane Morris LLP

(57) ABSTRACT

Novel oligocarbazole compounds containing a triphenylene and an oligocarbazole are provided. The compounds are useful in devices including organic light emitting devices (OLEDs).

20 Claims, 3 Drawing Sheets

(56) References Cited

U.S. PATENT DOCUMENTS

| | | | |
|---|---|---|---|
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,230,107 B1 | 6/2007 | Herron et al. |
| 7,232,618 B2 | 6/2007 | Yamada et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 7,655,323 B2 | 2/2010 | Walters et al. |
| 7,968,146 B2 | 6/2011 | Wanger et al. |
| 2001/0015432 A1 | 8/2001 | Igarashi |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0072964 A1 | 4/2003 | Kwong et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0115476 A1 | 6/2004 | Oshiyama et al. |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0123751 A1 | 6/2005 | Tsutsui et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0121308 A1 | 6/2006 | Katoh et al. |
| 2006/0127696 A1 | 6/2006 | Stossel et al. |
| 2006/0182992 A1 | 8/2006 | Nii et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0087321 A1 | 4/2007 | Pribenszky et al. |
| 2007/0103060 A1 | 5/2007 | Itoh et al. |
| 2007/0111026 A1 | 5/2007 | Deaton et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0261076 A1 | 10/2008 | Kwong et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0134784 A1* | 5/2009 | Lin ................... C07D 209/88 313/504 |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2009/0302743 A1 | 12/2009 | Kato et al. |
| 2009/0309488 A1 | 12/2009 | Kato et al. |
| 2010/0012931 A1 | 1/2010 | Kato et al. |
| 2010/0084966 A1 | 4/2010 | Otsu et al. |
| 2010/0090591 A1 | 4/2010 | Alleyne et al. |
| 2010/0148663 A1 | 6/2010 | Tsai et al. |
| 2010/0187984 A1 | 7/2010 | Lin et al. |
| 2010/0244004 A1 | 9/2010 | Xia et al. |
| 2010/0295032 A1 | 11/2010 | Kwong et al. |
| 2011/0057559 A1 | 3/2011 | Xia et al. |
| 2011/0163302 A1 | 7/2011 | Lin et al. |
| 2011/0204333 A1 | 8/2011 | Xia et al. |
| 2013/0026452 A1 | 1/2013 | Kottas et al. |
| 2013/0119354 A1 | 5/2013 | Ma et al. |

FOREIGN PATENT DOCUMENTS

| | | |
|---|---|---|
| EP | 1725079 | 11/2006 |
| EP | 2034538 | 3/2009 |
| EP | 1841834 | 5/2009 |
| EP | 2350216 | 10/2009 |
| JP | 2005-11610 | 1/2005 |
| JP | 2007-123392 | 5/2007 |
| JP | 2007/254297 | 10/2007 |
| JP | 2009-227514 | 10/2009 |
| JP | 2010-135467 | 6/2010 |
| WO | WO 01/39234 | 5/2001 |
| WO | WO 02/02714 | 1/2002 |
| WO | WO 02/15645 | 2/2002 |
| WO | WO 03/040257 | 5/2003 |
| WO | WO 03/060956 | 7/2003 |
| WO | WO 2004/093207 | 10/2004 |
| WO | WO 2004/107822 | 12/2004 |
| WO | WO 2004/111066 | 12/2004 |
| WO | WO 2005/014551 | 2/2005 |
| WO | WO 2005/019373 | 3/2005 |
| WO | WO 2005/030900 | 4/2005 |
| WO | WO 2005/089025 | 9/2005 |
| WO | WO 2005/123873 | 12/2005 |
| WO | WO 2006/009024 | 1/2006 |
| WO | WO 2006/056418 | 6/2006 |
| WO | WO 2006/072002 | 7/2006 |
| WO | WO 2006/082742 | 8/2006 |
| WO | WO 2006/098120 | 9/2006 |
| WO | WO 2006/100298 | 9/2006 |
| WO | WO 2006/103874 | 10/2006 |
| WO | WO 2006/114966 | 11/2006 |
| WO | WO 2006/132173 | 12/2006 |
| WO | WO 2007/002683 | 1/2007 |
| WO | WO 2007/004380 | 1/2007 |
| WO | WO 2007/063754 | 6/2007 |
| WO | WO 2007/063796 | 6/2007 |
| WO | WO 2008/044723 | 4/2008 |
| WO | WO 2008/056746 | 5/2008 |
| WO | WO 2008/057394 | 5/2008 |
| WO | WO 2008/101842 | 8/2008 |
| WO | WO 2008/132085 | 11/2008 |
| WO | WO 2009/000673 | 12/2008 |
| WO | WO 2009/003898 | 1/2009 |
| WO | WO 2009/008311 | 1/2009 |
| WO | WO 2009/018009 | 2/2009 |
| WO | WO 2009/021126 | 2/2009 |
| WO | WO 2009/050290 | 4/2009 |
| WO | WO 2009/062578 | 5/2009 |
| WO | WO 2009/063833 | 5/2009 |
| WO | WO 2009/066778 | 5/2009 |
| WO | WO 2009/066779 | 5/2009 |
| WO | WO 2009/086028 | 7/2009 |
| WO | WO 2009/100991 | 8/2009 |
| WO | WO 2010/011390 | 1/2010 |
| WO | WO 2010/028151 | 3/2010 |
| WO | WO 2010/056066 | 5/2010 |
| WO | WO 2010/079051 | 7/2010 |
| WO | WO 2010/086089 | 8/2010 |
| WO | WO 2010/107244 | 9/2010 |
| WO | WO 2010/111175 | 9/2010 |
| WO | WO 2011/044988 | 4/2011 |

(56) References Cited

FOREIGN PATENT DOCUMENTS

| WO | WO 2011/051404 | 5/2011 |
|---|---|---|
| WO | WO 2011/075644 | 6/2011 |
| WO | WO 2011/086863 | 7/2011 |

OTHER PUBLICATIONS

Adachi, Chihaya et al., "Organic Electroluminescent Device Having a Hole Conductor as an Emitting Layer," *Appl. Phys. Lett.*, 55(15):1489-1491 (1989).

Adachi, Chihaya et al., "High-Efficiency Red Electrophosphorescence Devices," *Appl. Phys. Lett.*, 78(11):1622-1624 (2001).

Adachi, Chihaya et al., "Nearly 100% Internal Phosphorescence Efficiency in an Organic Light Emitting Device," *J. Appl. Phys.*, 90(10):5048-5051 (2001).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

Chang, Chiung-Fang et al, "Highly Efficient Blue-Emitting Iridium(III) Carbene Complexes and Phosphorescent OLEDs," *Angew. Chem. Int. Ed.* 47, 4542 (2008).

Gao, Zhiqiang et al., "Bright-Blue Electroluminescence From a Silyl-Substituted ter-(phenylene-vinylene) derivative," *Appl. Phys. Lett.*, 74(6):865-867 (1999).

Guo, Tzung-Fang et al., "Highly Efficient Electrophosphorescent Polymer Light-Emitting Devices," *Organic Electronics*, 1:15-20 (2000).

Hamada, Yuji et al., "High Luminance in Organic Electroluminescent Devices with Bis(10-hydroxybenzo[h]quinolinato)beryllium as an Emitter," *Chem. Lett.*, 905-906 (1993).

Holmes, R.J. et al., "Blue Organic Electrophosphorescence Using Exothermic Host-Guest Energy Transfer," *Appl. Phys. Lett.*, 82(15):2422-2424 (2003).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Huang, Wei-Sheng et al., "Highly Phosphorescent Bis-Cyclometalated Iridium Complexes Containing Benzoimidazole-Based Ligands." *Chem. Mater.*, 16(12):2480-2488 (2004).

Hung, L.S. et al., "Anode Modification in Organic Light-Emitting Diodes by Low-Frequency Plasma Polymerization of $CHF_3$," *Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Ikeda, Hisao et al., "P-185: Low-Drive-Voltage OLEDs with a Buffer Layer Having Molybdenum Oxide," *SID Symposium Digest*, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Kido, Junji et al., 1,2,4-Triazole Derivative as an Electron Transport Layer in Organic Electroluminescent Devices, *Jpn. J. Appl. Phys.*, 32:L917-L920 (1993).

Kuwabara, Yoshiyuki et al., "Thermally Stable Multilayered Organic Electroluminescent Devices Using Novel Starburst Molecules, 4,4',4''-Tri(N-carbazolyl)triphenylamine (TCTA) and 4,4'4''-Tris(3-methylphenylphenyl-amino)triphenylamine (m-MTDATA), as Hole-Transport Materials," *Adv. Mater.*, 6(9):677-679 (1994).

Kwong, Raymond C. et al., "High Operational Stability of Electrophosphorescent Devices," *Appl. Phys. Lett.*, 81(1):162-164 (2002).

Lamansky, Sergey et al., "Synthesis and Characterization of Phosphorescent Cyclometalated Iridium Complexes," *Inorg. Chem.*, 40(7):1704-1711 (2001).

Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Lo, Shih-Chun et al., "Blue Phosphorescence from Iridium(III) Complexes at Room Temperature," *Chem. Mater.*, 18(21):5119-5129 (2006).

Ma, Yuguang et al., "Triplet Luminescent Dinuclear-Gold(I) Complex-Based Light-Emitting Diodes with Low Turn-On voltage," *Appl. Phys. Lett.*, 74(10):1361-1363 (1999).

Mi, Bao-Xiu et al., "Thermally Stable Hole-Transporting Material for Organic Light-Emitting Diode: an Isoindole Derivative," *Chem. Mater.*, 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 37(4):592-593 (2005).

Niu, Yu-Hua et al., "Highly Efficient Electrophosphorescent Devices with Saturated Red Emission from a Neutral Osmium Complex," *Chem. Mater.*, 17(13):3532-3536 (2005).

Noda, Tetsuya and Shirota, Yasuhiki, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," *J. Am. Chem. Soc.*, 120 (37):9714-9715 (1998).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Östergård, T. et al., "Langmuir-Blodgett Light-Emitting Diodes Of Poly(3-Hexylthiophene): Electro-Optical Characteristics Related to Structure," *Synthetic Metals*, 87:171-177 (1997).

Palilis, Leonidas C., "High Efficiency Molecular Organic Light-Emitting Diodes Based On Silole Derivatives and Their Exciplexes," *Organic Electronics*, 4:113-121 (2003).

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Sakamoto, Youichi et al., "Synthesis, Characterization, and Electron-Transport Property of Perfluorinated Phenylene Dendrimers," *J. Am. Chem. Soc.*, 122(8):1832-1833 (2000).

Salbeck, J. et al., "Low Molecular Organic Glasses for Blue Electroluminescence," *Synthetic Metals*, 91:209-215 (1997).

Shirota, Yasuhiko et al., "Starburst Molecules Based on π-Electron Systems as Materials for Organic Electroluminescent Devices," *Journal of Luminescence*, 72-74:985-991 (1997).

Sotoyama, Wataru et al., "Efficient Organic Light-Emitting Diodes with Phosphorescent Platinum Complexes Containing N^C^N-Coordinating Tridentate Ligand," *Appl. Phys. Lett.*, 86:153505-1-153505-3 (2005).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Takizawa, Shin-ya et al., "Phosphorescent Iridium Complexes Based on 2-Phenylimidazo[1,2- β]pyridine Ligands: Tuning of Emission Color Toward the Blue Region and Application to Polymer Light-Emitting Devices," *Inorg. Chem.*, 46(10):4308-4319 (2007).

Tang, C.W. and VanSlyke, S.A., "Organic Electroluminescent Diodes," *Appl. Phys. Lett.*, 51(12):913-915 (1987).

Tung, Yung-Liang et al., "Highly Efficient Red Phosphorescent Osmium(II) Complexes for OLED Applications," *Organometallics* 23, 3745 (2004).

Tung, Yung-Liang et al., "Organic Light-Emitting Diodes Based on Charge-Neutral $Ru^{II}$ Phosphorescent Emitters," *Adv. Mater.*, 17(8):1059-1064 (2005).

(56) References Cited

OTHER PUBLICATIONS

Van Slyke, S. A. et al., "Organic Electroluminescent Devices with Improved Stability," *Appl. Phys. Lett.*, 69(15):2160-2162 (1996).
Wang, Y. et al., "Highly Efficient Electroluminescent Materials Based on Fluorinated Organometallic Iridium Compounds," *Appl. Phys. Lett.*, 79(4):449-451 (2001).
Wong, Keith Man-Chung et al., A Novel Class of Phosphorescent Gold(III) Alkynyl-Based Organic Light-Emitting Devices with Tunable Colour, *Chem. Commun.*, 2906-2908 (2005).
Wong, Wai-Yeung et al., "Multifunctional Iridium Complexes Based on Carbazole Modules as Highly Efficient Electrophosphors," *Angew. Chem. Int. Ed.*, 45:7800-7803 (2006).
Baldo et al., "Highly Efficient Phosphorescent Emission from Organic Electroluminescent Devices," Nature, vol. 395, 151-154, (1998).
Baldo et al., "Very high-efficiency green organic light-emitting devices based on electrophosphorescence," Appl. Phys. Lett., vol. 75, No. 1, 4-6 (1999).

\* cited by examiner

Formula I-A

ORGANIC ELECTROLUMINESCENT MATERIALS AND DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to novel organic compounds containing a triphenylene and an oligocarbazole. The compounds are useful in devices including organic light emitting devices (OLEDs).

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices, organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device, OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

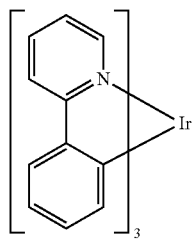

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

A new class of compounds containing a triphenylene and an oligocarbazole moiety are provided.

The present invention provides compounds having formula I:

A-L-C (I).

In the compound of formula I, A has the formula:

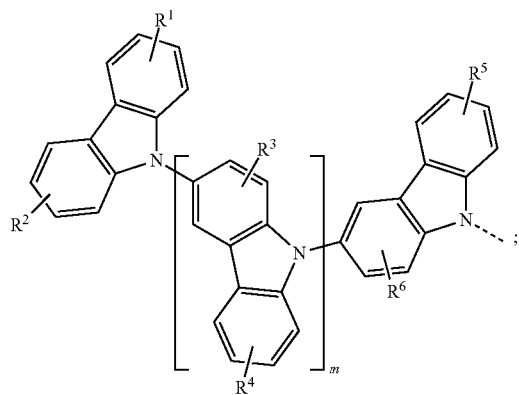

(II)

C has the formula:

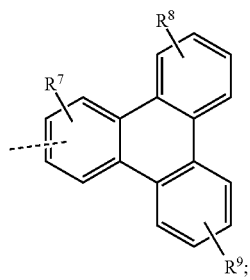

(III)

L has the formula:

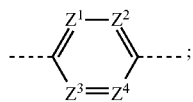

(IV)

$R^1$, $R^2$, $R^4$, $R^5$, $R^8$ and $R^9$ each independently represent mono, di, tri, tetra substitutions, or no substitution; $R^3$, $R^6$ and $R^7$ each independently represent mono, di, tri substitutions, or no substitution; m is an integer from 0 to 10; $R^1$, $R^2$, $R^3$, $R^4$, $R^5$, $R^6$, $R^7$, $R^8$ and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and $Z^1$, $Z^2$, $Z^3$ and $Z^4$ are each independently selected from the group consisting of N, CH and CD.

In some embodiments, $R^1$, $R^2$, $R^3$, $R^4$, $R^5$, $R^6$, $R^7$, $R^8$ and $R^9$ are each independently selected from the group consisting of hydrogen, deuterium, aryl, heteroaryl, and combinations thereof.

In some embodiments, $R^1$, $R^2$, $R^3$, $R^4$, $R^5$, $R^6$, $R^7$, $R^8$ and $R^9$ are each independently selected from the group consisting of hydrogen, deuterium, phenyl, and combinations thereof.

In some embodiments, $R^1$, $R^2$, $R^3$, $R^4$, $R^5$, and $R^6$ are hydrogen.

In some embodiments, L is selected from the group consisting of phenyl and pyridine.

In some embodiments, L is selected from the group consisting of:

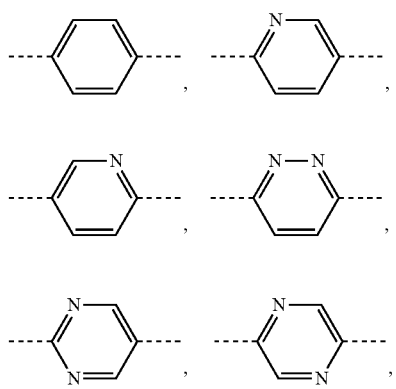

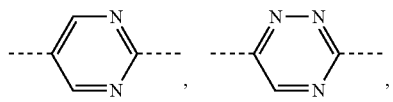

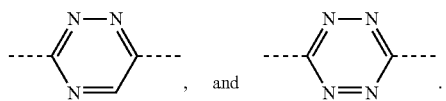

In some embodiments, A is selected from the group consisting of:

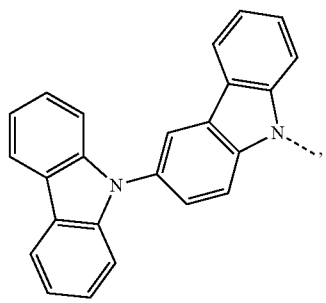

A1

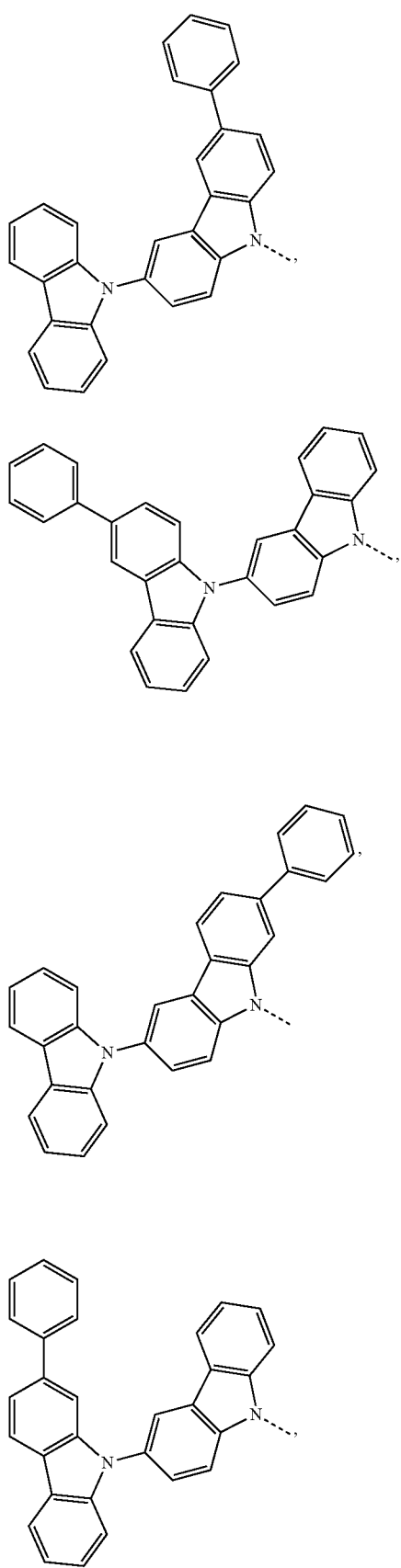

A10
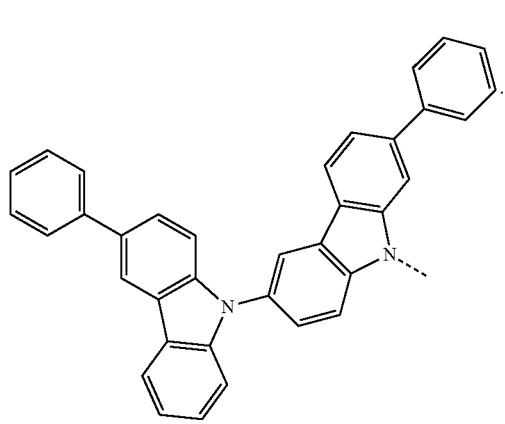
In some embodiments, A is selected from the group consisting of:
A1
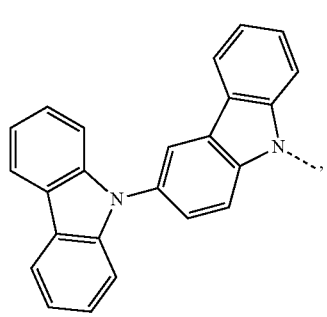
A2
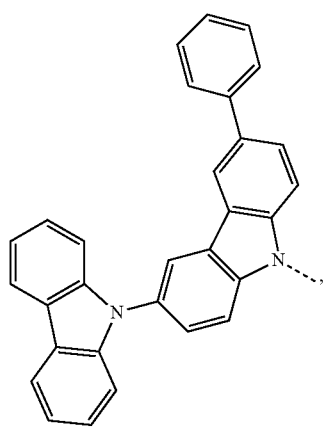
A3
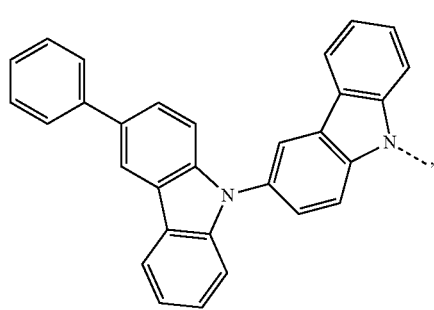
A4
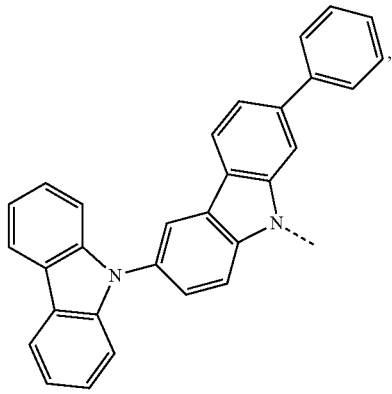
A5
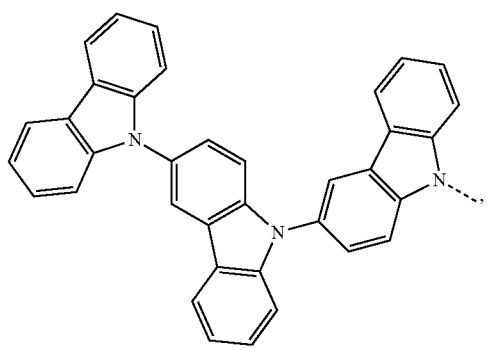
A6
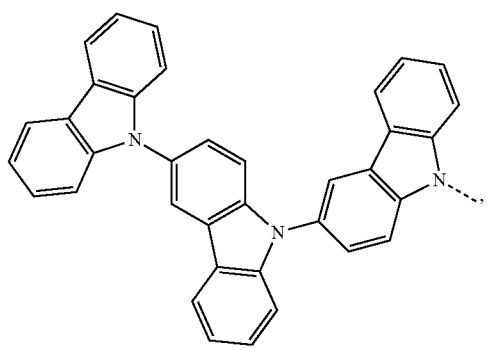
A7
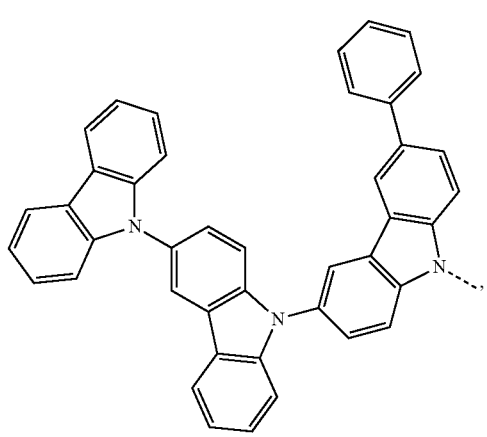

-continued
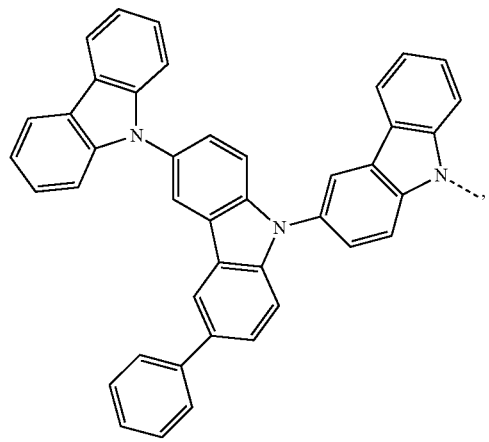
A8
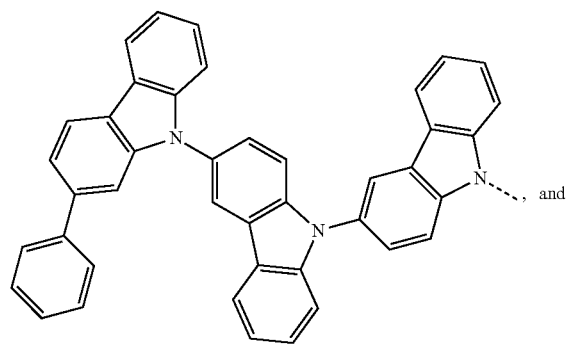
A9
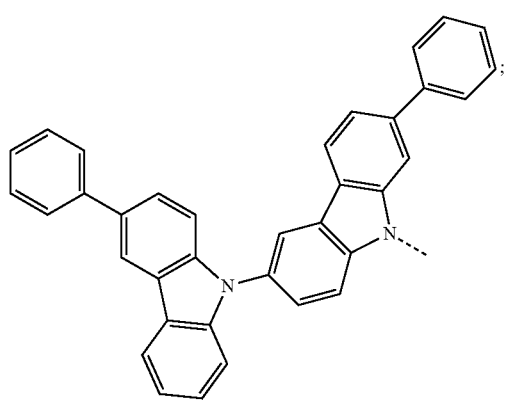
A10
L is selected from the group consisting of:
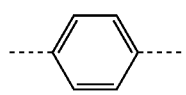
L1
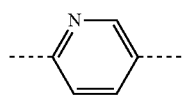
L2
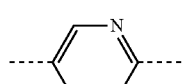
L3
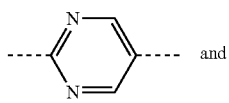
L4
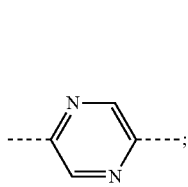
L5
and
C is selected from the group consisting of:
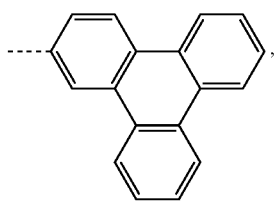
C1
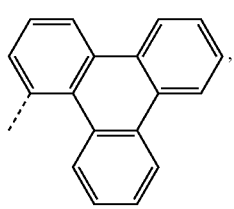
C2
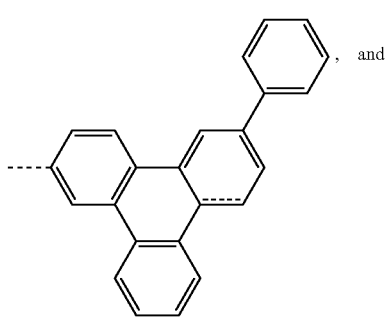
C3
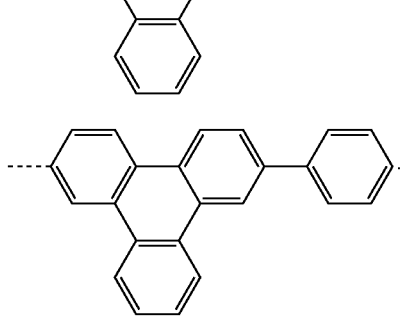
C4
In some embodiments, the compound of formula I is selected from the group consisting of Compound 1 to Compound 200 listed in TABLE 1.
In some embodiments, the compound of formula I has the formula:

Comp 1

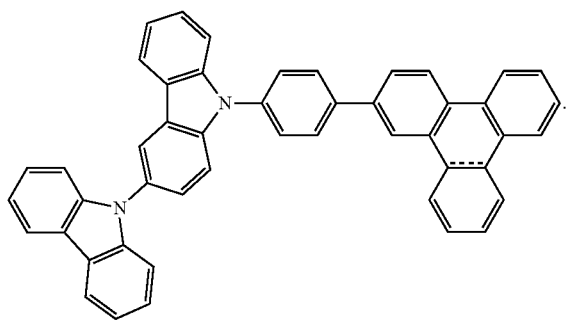

In some embodiments, a first device is provided. The first device comprises a first organic light emitting device, further comprising: an anode; a cathode; and an organic layer, disposed between the anode and the cathode, comprising a compound having the formula:

A-L-C    (I).

In the compound of formula I, A has the formula:

(II)

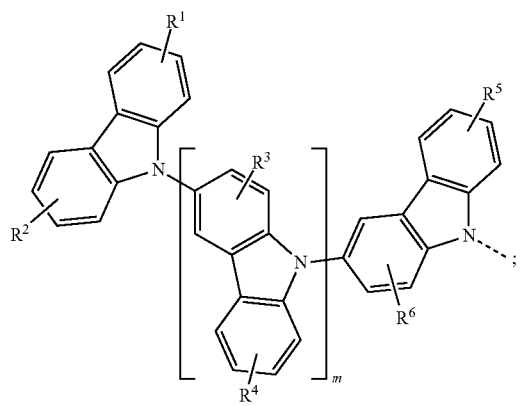

C has the formula:

(III)

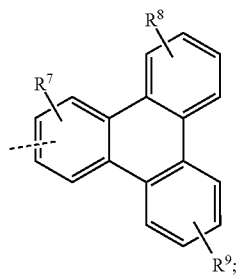

L has the formula:

(IV)

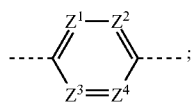

$R^1$, $R^2$, $R^4$, $R^5$, $R^8$ and $R^9$ each independently represent mono, di, tri, tetra substitutions, or no substitution; $R^3$, $R^6$ and $R^7$ each independently represent mono, di, tri substitutions, or no substitution; m is an integer from 0 to 10; $R^1$, $R^2$, $R^3$, $R^4$, $R^5$, $R^6$, $R^7$, $R^8$ and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and $Z^1$, $Z^2$, $Z^3$ and $Z^4$ are each independently selected from the group consisting of N, CH and CD.

In some embodiments, the organic layer of the device is an emissive layer and the compound of the formula I is a host.

In some embodiments, the organic layer of the device further comprises a phosphorescent emissive dopant.

In some embodiments, the phosphorescent emissive dopant of the device is a transition metal complex having at least one ligand or part of the ligand if the ligand is more than bidentate selected from the group consisting of:

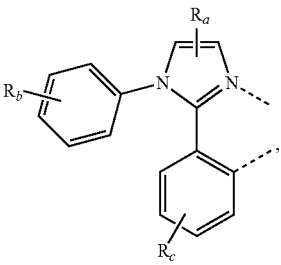

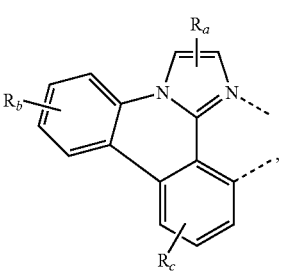

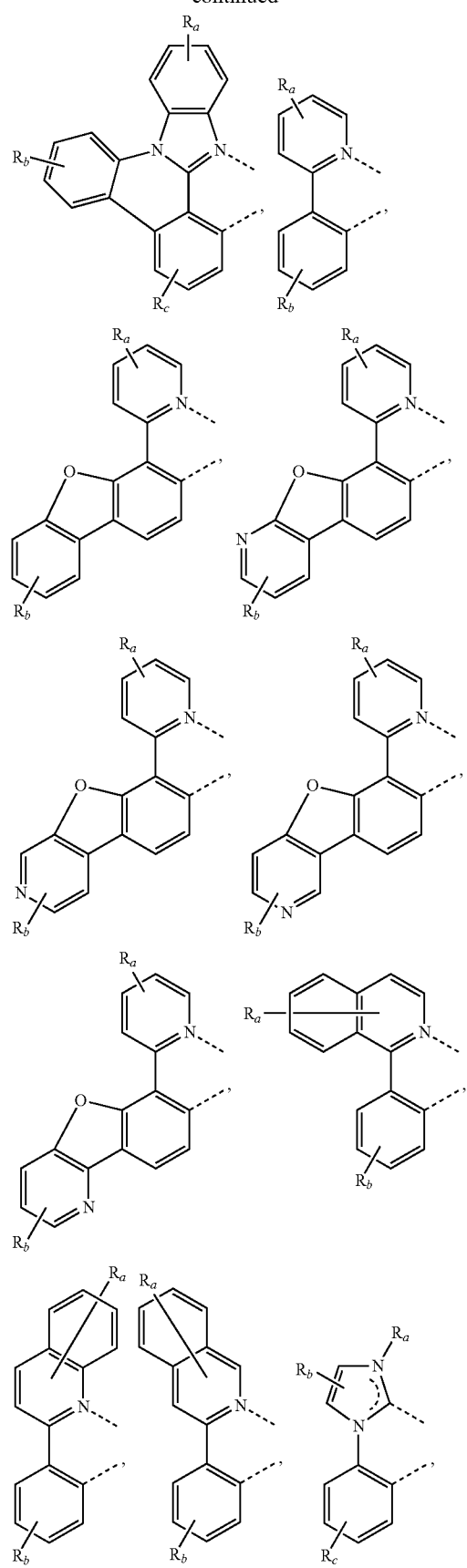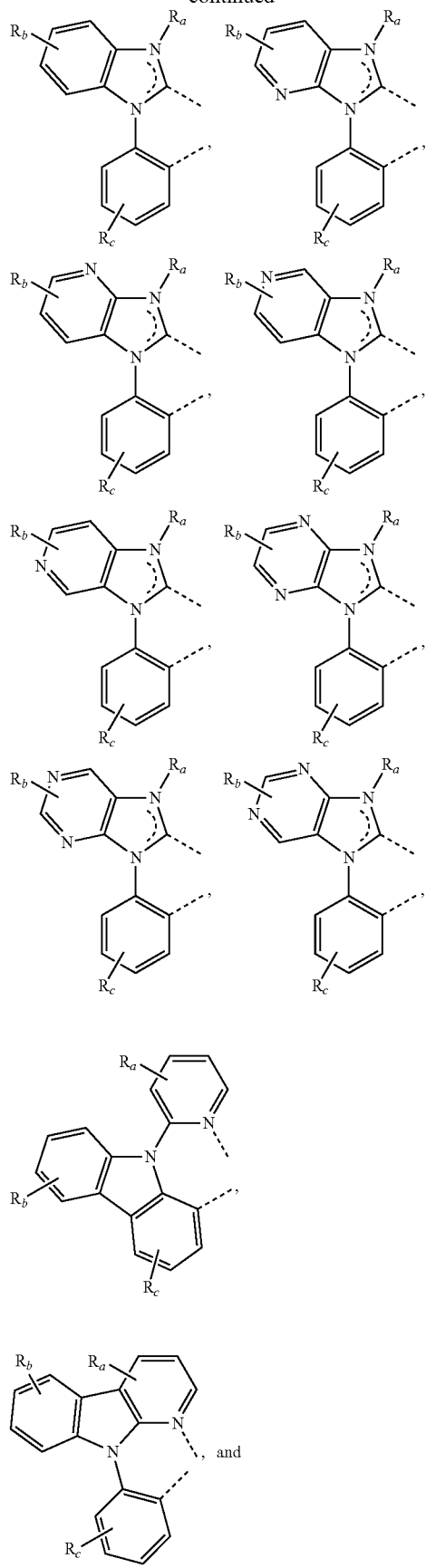

-continued

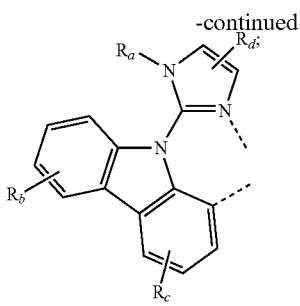

wherein $R_a$, $R_b$, $R_c$, and $R_d$ may represent mono, di, tri, or tetra substitution, or no substitution;

wherein $R_a$, $R_b$, $R_c$, and $R_d$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R_a$, $R_b$, $R_c$, and $R_d$ are optionally joined to form a fused ring or form a multidentate ligand.

In some embodiments, the organic layer of the device is a blocking layer and the compound is a blocking material in the organic layer.

In some embodiments, the device is a consumer product.

In some embodiments, the device is an organic light-emitting device.

In some embodiments, the device comprises a lighting panel.

In some embodiments, the device comprises a compound of formula I which is:

Comp 1

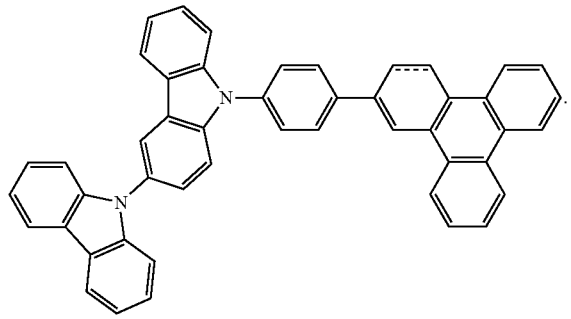

In some embodiments, a formulation comprising a compound having the formula:

A-L-C (I)

is provided.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the pertinent art to make and use the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
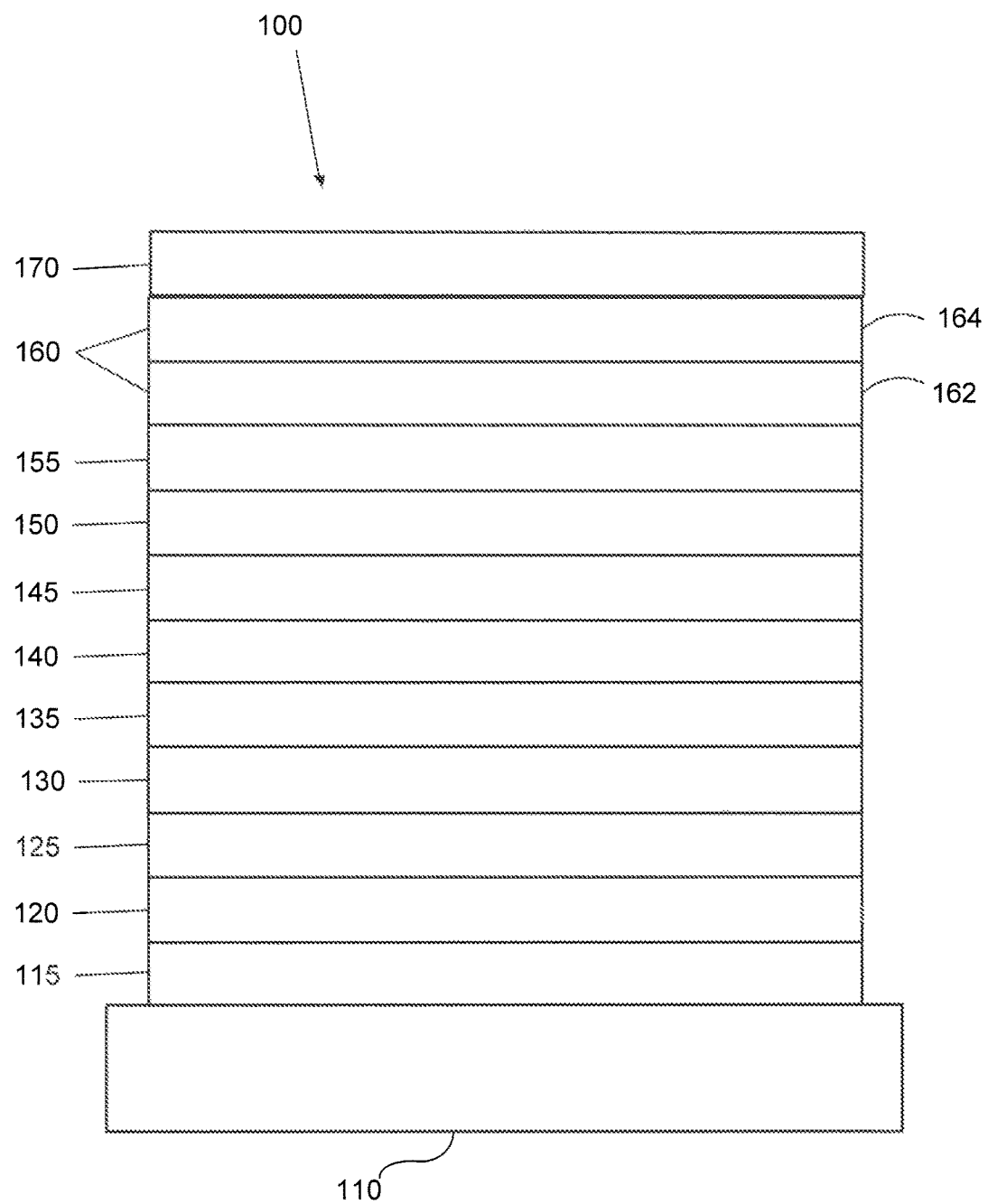
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
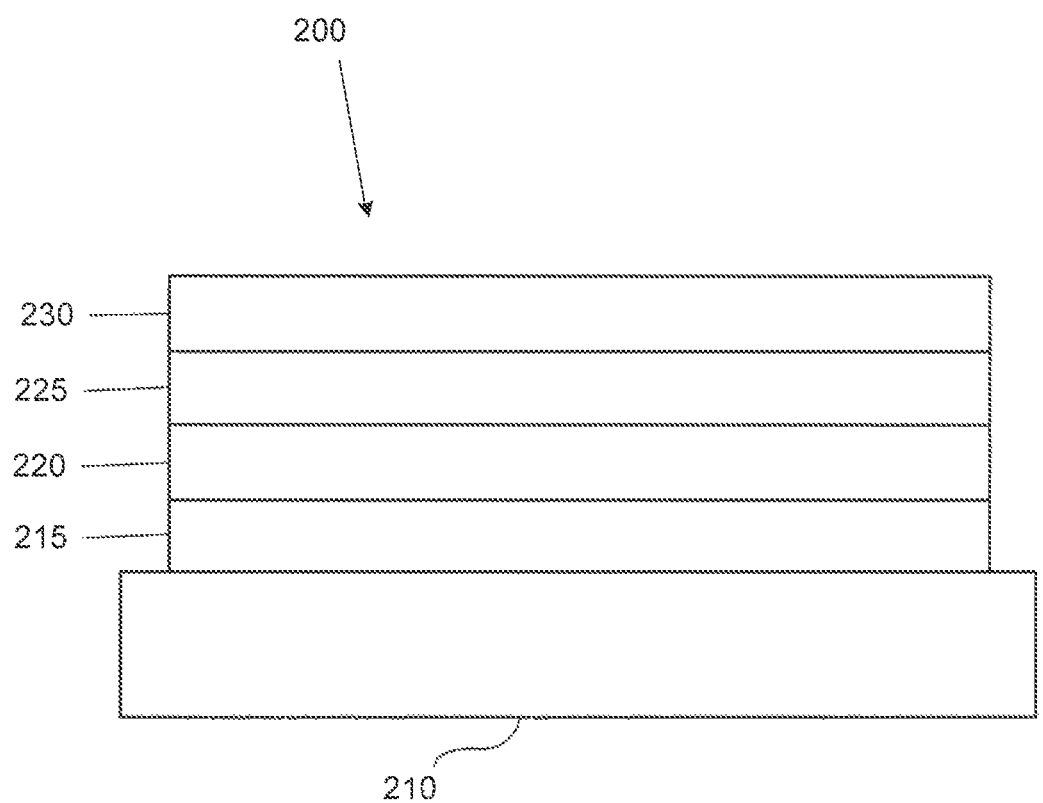
FIG. 2 shows an inverted organic light emitting device that does not have a separate electron transport layer.
Figure 3:
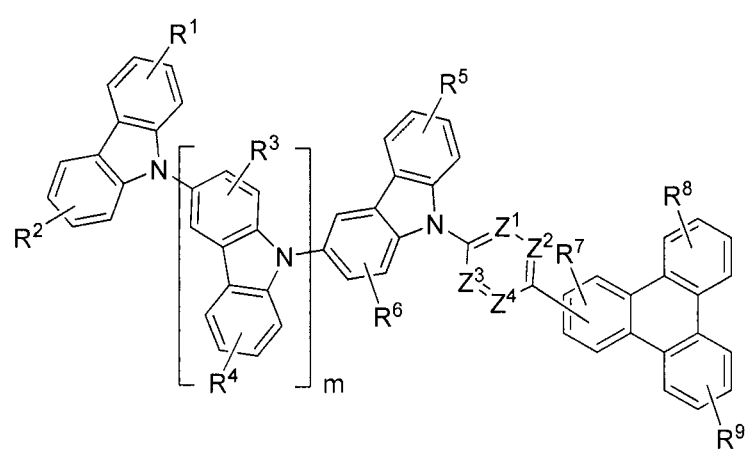
FIG. 3 shows a compound of Formula I-A.

FIG. 2 shows an inverted OLED 200, The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200, FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In some embodiments, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer Monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degrees C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

As used herein, "substituted" indicates that a substituent other than His bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

A wide variety of carboxylic and heterocyclic functional groups, including triphenylene and carbazole, have been used to synthesize compound for organic electroluminescent materials. Depending on the unique ways building blocks are connected, these compounds have different thermal stability, energy levels, molecular packing, and charge-transport properties, all of which heavily influence device performance. This invention discloses a new class of compounds where triphenylene is connected to an oligocarbazole through an appropriate aromatic linking unit. Unexpectedly, phosphorescent OLED devices using the compounds of the invention as host materials demonstrate superior stability compared to the compounds reported in the literature. The enhanced device performance may be due to boosted intrinsic materials stability and improved charge carrier balance.

In some embodiments, a compound having the formula:

A-L-C    (I)

is provided. In the compound of formula I, A has the formula:

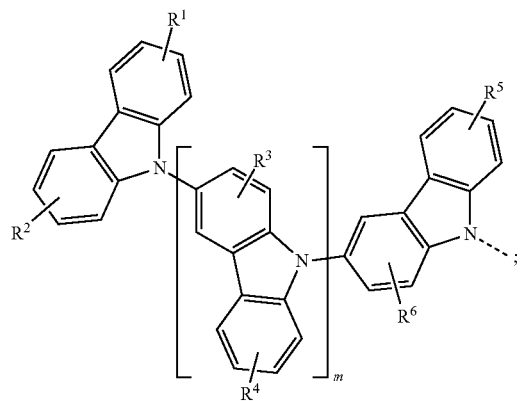

(II)

C has the formula:

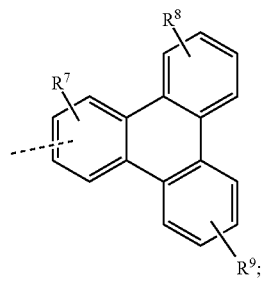

(III)

and L has the formula:

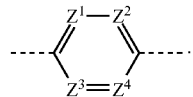

(IV)

$R^1$, $R^2$, $R^4$, $R^5$, $R^8$ and $R^9$ each independently represent mono, di, tri, tetra substitutions, or no substitution; $R^3$, $R^6$ and $R^7$ each independently represent mono, di, tri substitutions, or no substitution; m is an integer from 0 to 10; $R^1$, $R^2$, $R^3$, $R^4$, $R^5$, $R^6$, $R^7$, $R^8$ and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfanyl, sulfonyl, phosphino, and combinations thereof; and $Z^1$, $Z^2$, $Z^3$ and $Z^4$ are each independently selected from the group consisting of N, CH and CD.

In some embodiments, a compound having the formula I-A:

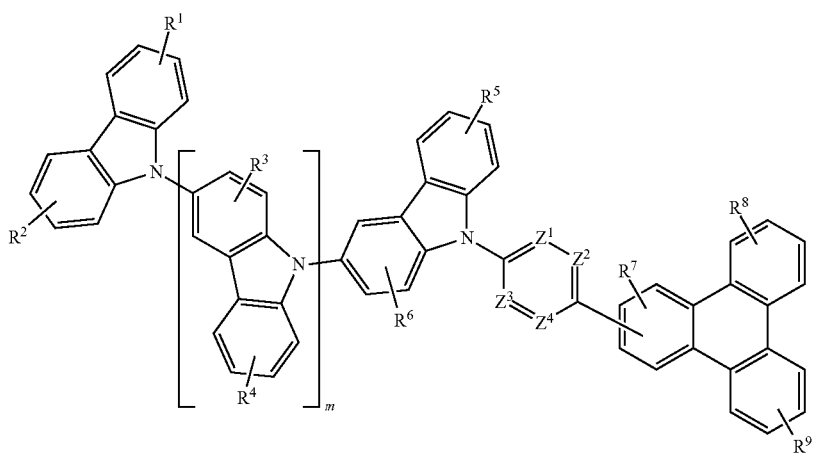

(I-A)

is provided. In the compound of formula I-A, $R^1$, $R^2$, $R^4$, $R^5$, $R^8$ and $R^9$ each independently represent mono, di, tri, tetra substitutions, or no substitution; $R^3$, $R^6$ and $R^7$ each independently represent mono, di, tri substitutions, or no substitution; m is an integer from 0 to 10; $R^1$, $R^2$, $R^3$, $R^4$, $R^5$, $R^6$, $R^7$, $R^8$ and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and $Z^1$, $Z^2$, $Z^3$ and $Z^4$ are each independently selected from the group consisting of N, CH and CD.

In some embodiments, $R^1$, $R^2$, $R^3$, $R^4$, $R^5$, $R^6$, $R^7$, $R^8$ and $R^9$ are each independently selected from the group consisting of hydrogen, deterium, aryl, heteroaryl, and combinations thereof.

In some embodiments, $R^1$, $R^2$, $R^3$, $R^4$, $R^5$, $R^6$, $R^7$, $R^8$ and $R^9$ are each independently selected from the group consisting of hydrogen, deuterium, phenyl, and combinations thereof.

In some embodiments, $R^1$, $R^2$, $R^3$, $R^4$, $R^5$, $R^6$, $R^7$, $R^8$ and $R^9$ are hydrogen.

In some embodiments, L is selected from the group consisting of phenyl and pyridine.

In some embodiments, L is selected from the group consisting of:

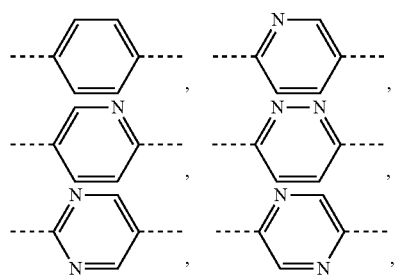

-continued

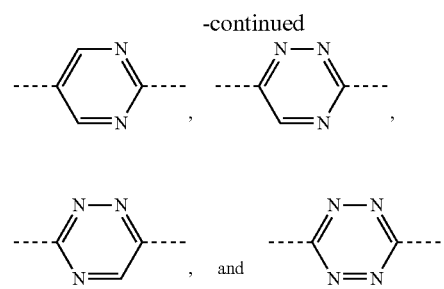

In some embodiments, A is selected from the group consisting of:

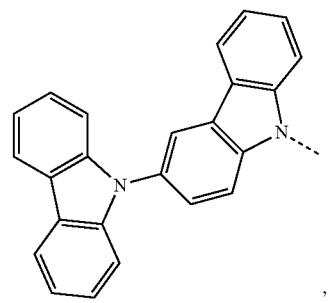

A1

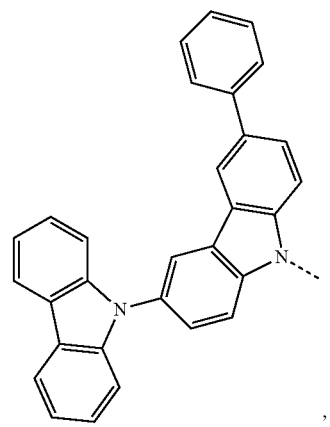

A2

A3
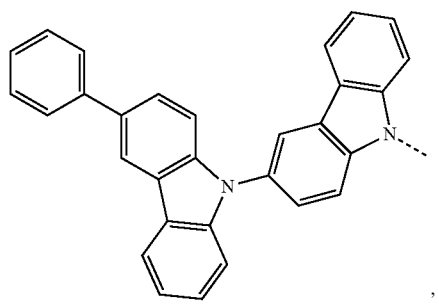
A4
A5
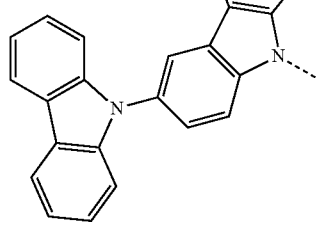
A6
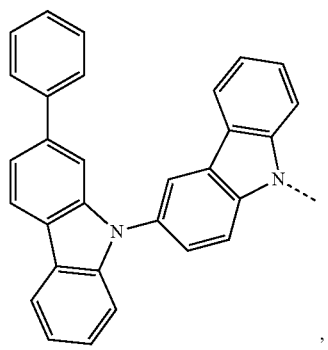
A7
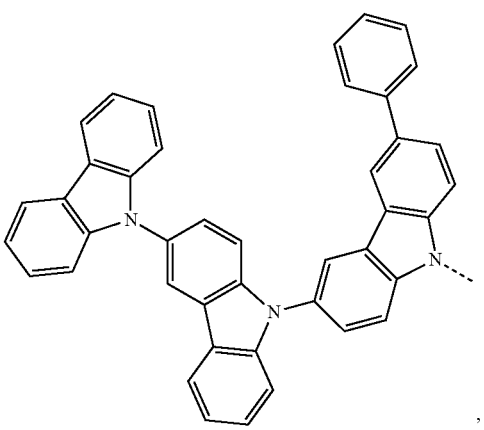
A8
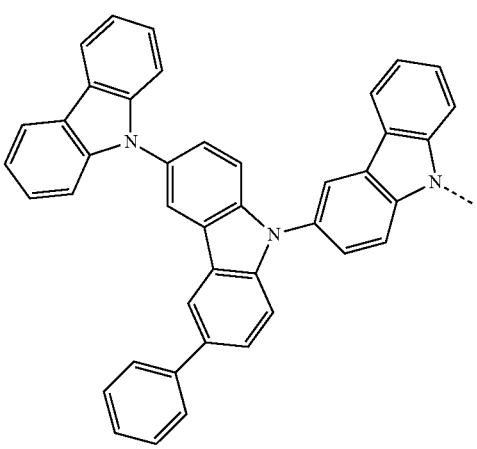
A9
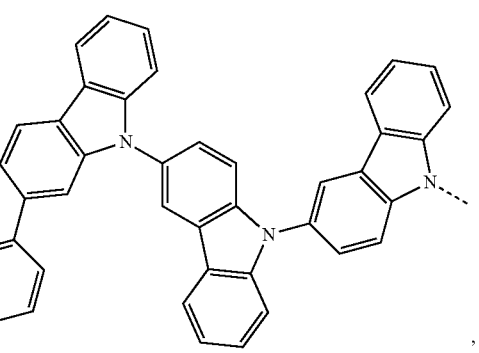
, and -continued
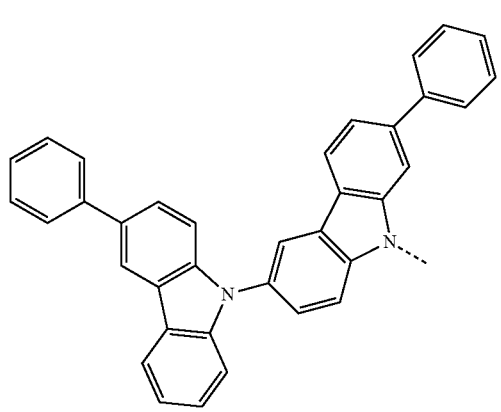
A10
In some embodiments, A is selected from the group consisting of:
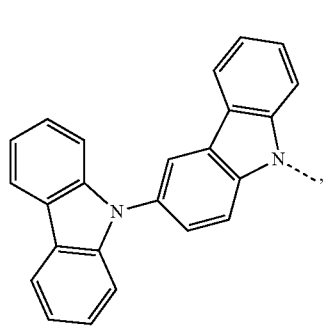
A1
A2
A3
-continued
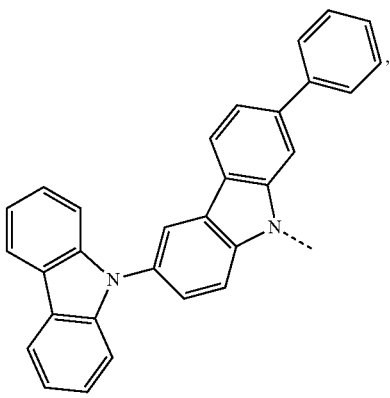
A4
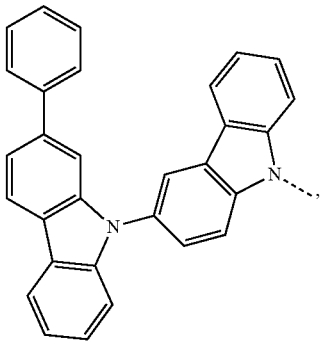
A5
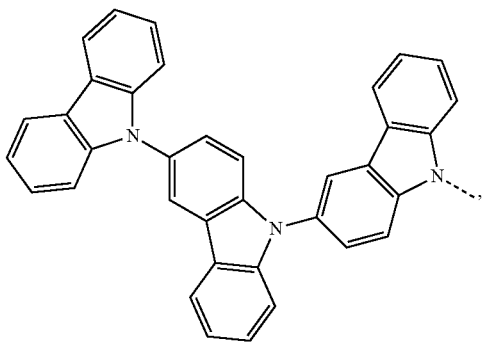
A6
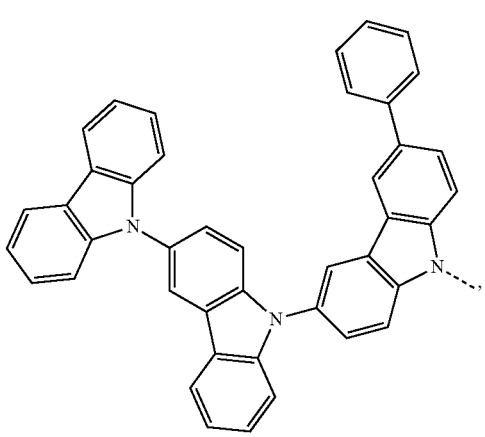
A7

-continued
A8
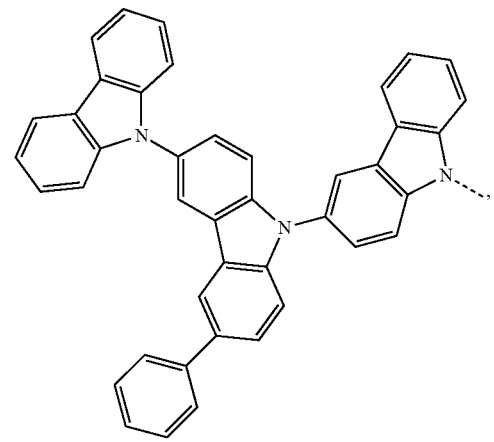
A9
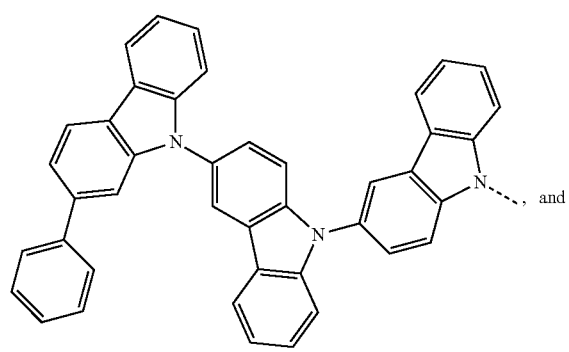
A10
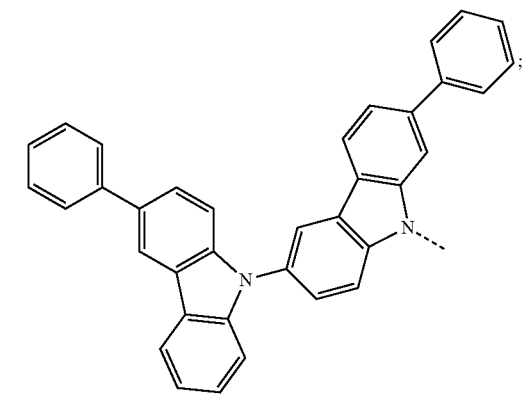
L is selected from the group consisting of:
L1
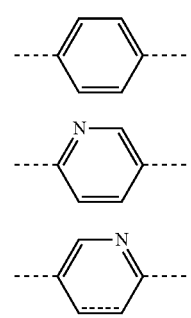
L2
L3
L4
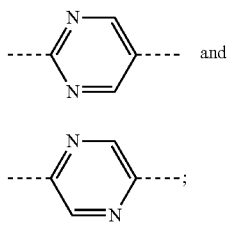
L5
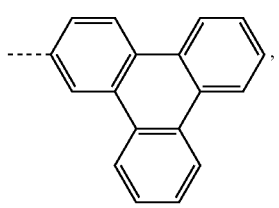
and
C is selected from the group consisting of:
C1
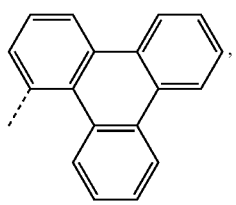
C2
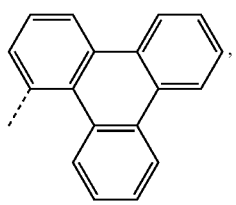
C3
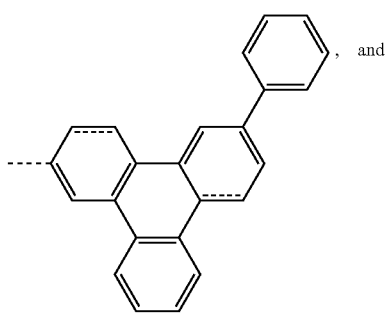
C4
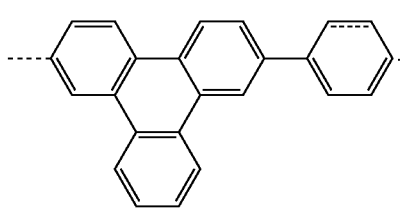
In some embodiments, A is selected from the group consisting of:

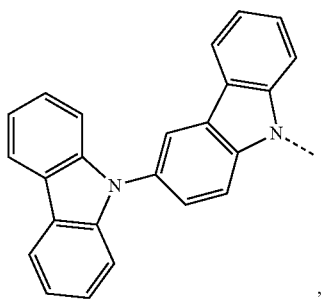 A1
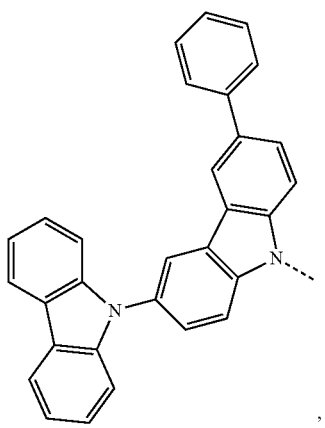 A2
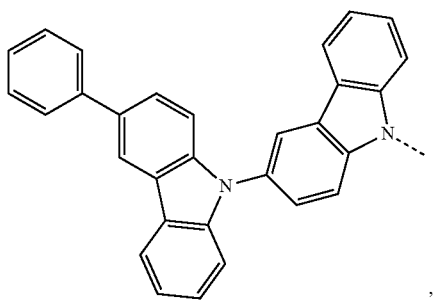 A3
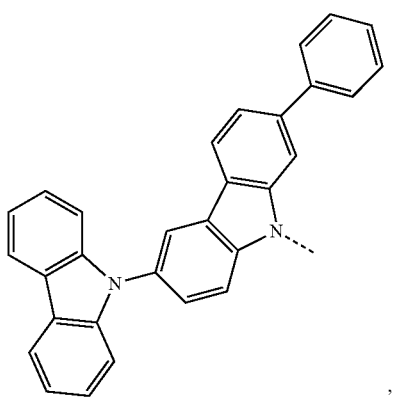 A4
-continued
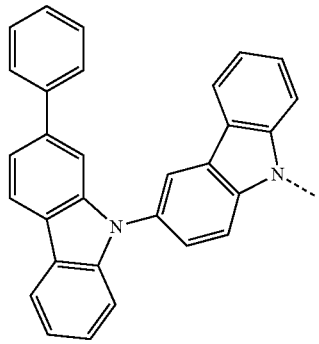 A5
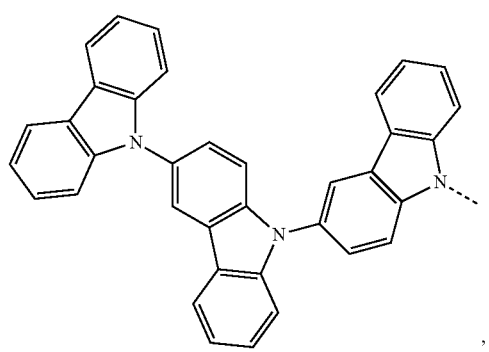 A6
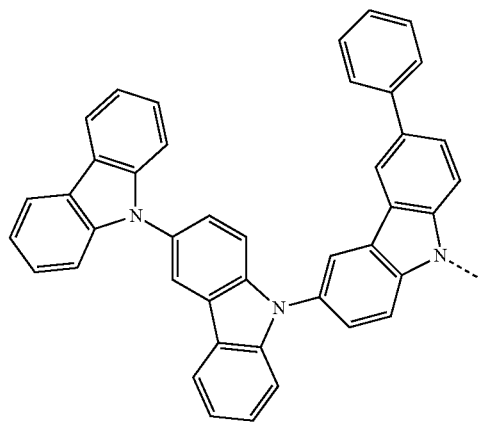 A7
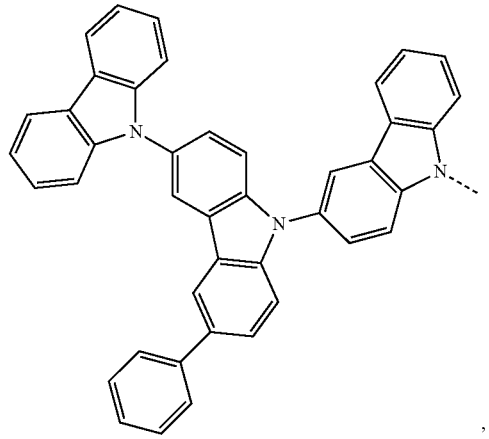 A8

-continued

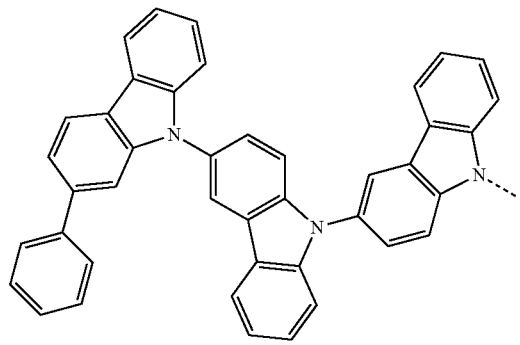

A9

, and

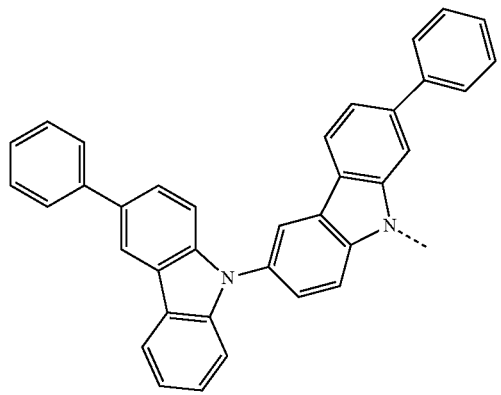

A10

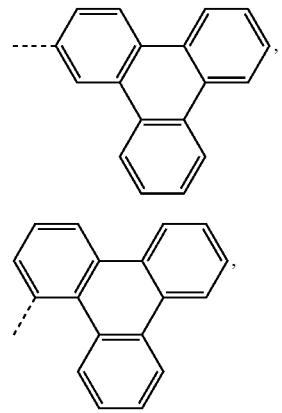

C1

C2

C3

, and

C4

In some embodiments, A is A1.

In some embodiments, L is selected from the group consisting of:

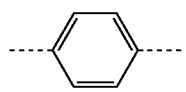

L1

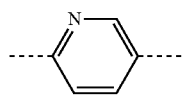

L2

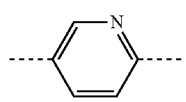

L3

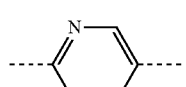

L4 and

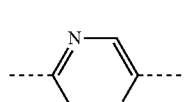

L5

In some embodiments, L is L1.

In some embodiments, C is selected from the group consisting of:

In some embodiments, C is C1.

In some embodiments, A is A1, L is L1, and C is C1.

In some embodiments, the compound is selected from the group consisting of Compound 1 to Compound 200 listed in TABLE 1.

TABLE 1

| Comp # | A | L | C |
|---|---|---|---|
| Comp 1 | A1 | L1 | C1 |
| Comp 2 | A2 | L1 | C1 |
| Comp 3 | A3 | L1 | C1 |
| Comp 4 | A4 | L1 | C1 |
| Comp 5 | A5 | L1 | C1 |
| Comp 6 | A6 | L1 | C1 |
| Comp 7 | A7 | L1 | C1 |
| Comp 8 | A8 | L1 | C1 |
| Comp 9 | A9 | L1 | C1 |
| Comp 10 | A10 | L1 | C1 |
| Comp 11 | A1 | L2 | C1 |
| Comp 12 | A2 | L2 | C1 |
| Comp 13 | A3 | L2 | C1 |
| Comp 14 | A4 | L2 | C1 |
| Comp 15 | A5 | L2 | C1 |
| Comp 16 | A6 | L2 | C1 |
| Comp 17 | A7 | L2 | C1 |
| Comp 18 | A8 | L2 | C1 |
| Comp 19 | A9 | L2 | C1 |
| Comp 20 | A10 | L2 | C1 |
| Comp 21 | A1 | L3 | C1 |
| Comp 22 | A2 | L3 | C1 |

TABLE 1-continued

| Comp # | A | L | C |
|---|---|---|---|
| Comp 23 | A3 | L3 | C1 |
| Comp 24 | A4 | L3 | C1 |
| Comp 25 | A5 | L3 | C1 |
| Comp 26 | A6 | L3 | C1 |
| Comp 27 | A7 | L3 | C1 |
| Comp 28 | A8 | L3 | C1 |
| Comp 29 | A9 | L3 | C1 |
| Comp 30 | A10 | L3 | C1 |
| Comp 31 | A1 | L4 | C1 |
| Comp 32 | A2 | L4 | C1 |
| Comp 33 | A3 | L4 | C1 |
| Comp 34 | A4 | L4 | C1 |
| Comp 35 | A5 | L4 | C1 |
| Comp 36 | A6 | L4 | C1 |
| Comp 37 | A7 | L4 | C1 |
| Comp 38 | A8 | L4 | C1 |
| Comp 39 | A9 | L4 | C1 |
| Comp 40 | A10 | L4 | C1 |
| Comp 41 | A1 | L5 | C1 |
| Comp 42 | A2 | L5 | C1 |
| Comp 43 | A3 | L5 | C1 |
| Comp 44 | A4 | L5 | C1 |
| Comp 45 | A5 | L5 | C1 |
| Comp 46 | A6 | L5 | C1 |
| Comp 47 | A7 | L5 | C1 |
| Comp 48 | A8 | L5 | C1 |
| Comp 49 | A9 | L5 | C1 |
| Comp 50 | A10 | L5 | C1 |
| Comp 51 | A1 | L1 | C2 |
| Comp 52 | A2 | L1 | C2 |
| Comp 53 | A3 | L1 | C2 |
| Comp 54 | A4 | L1 | C2 |
| Comp 55 | A5 | L1 | C2 |
| Comp 56 | A6 | L1 | C2 |
| Comp 57 | A7 | L1 | C2 |
| Comp 58 | A8 | L1 | C2 |
| Comp 59 | A9 | L1 | C2 |
| Comp 60 | A10 | L1 | C2 |
| Comp 61 | A1 | L2 | C2 |
| Comp 62 | A2 | L2 | C2 |
| Comp 63 | A3 | L2 | C2 |
| Comp 64 | A4 | L2 | C2 |
| Comp 65 | A5 | L2 | C2 |
| Comp 66 | A6 | L2 | C2 |
| Comp 67 | A7 | L2 | C2 |
| Comp 68 | A8 | L2 | C2 |
| Comp 69 | A9 | L2 | C2 |
| Comp 70 | A10 | L2 | C2 |
| Comp 71 | A1 | L3 | C2 |
| Comp 72 | A2 | L3 | C2 |
| Comp 73 | A3 | L3 | C2 |
| Comp 74 | A4 | L3 | C2 |
| Comp 75 | A5 | L3 | C2 |
| Comp 76 | A6 | L3 | C2 |
| Comp 77 | A7 | L3 | C2 |
| Comp 78 | A8 | L3 | C2 |
| Comp 79 | A9 | L3 | C2 |
| Comp 80 | A10 | L3 | C2 |
| Comp 81 | A1 | L4 | C2 |
| Comp 82 | A2 | L4 | C2 |
| Comp 83 | A3 | L4 | C2 |
| Comp 84 | A4 | L4 | C2 |
| Comp 85 | A5 | L4 | C2 |
| Comp 86 | A6 | L4 | C2 |
| Comp 87 | A7 | L4 | C2 |
| Comp 88 | A8 | L4 | C2 |
| Comp 89 | A9 | L4 | C2 |
| Comp 90 | A10 | L4 | C2 |
| Comp 91 | A1 | L5 | C2 |
| Comp 92 | A2 | L5 | C2 |
| Comp 93 | A3 | L5 | C2 |
| Comp 94 | A4 | L5 | C2 |
| Comp 95 | A5 | L5 | C2 |
| Comp 96 | A6 | L5 | C2 |
| Comp 97 | A7 | L5 | C2 |
| Comp 98 | A8 | L5 | C2 |
| Comp 99 | A9 | L5 | C2 |
| Comp 100 | A10 | L5 | C2 |
| Comp 101 | A1 | L1 | C3 |
| Comp 102 | A2 | L1 | C3 |
| Comp 103 | A3 | Li | C3 |
| Comp 104 | A4 | L1 | C3 |
| Comp 105 | A5 | L1 | C3 |
| Comp 106 | A6 | L1 | C3 |
| Comp 107 | A7 | L1 | C3 |
| Comp 108 | A8 | L1 | C3 |
| Comp 109 | A9 | L1 | C3 |
| Comp 110 | A10 | L1 | C3 |
| Comp 111 | A1 | L2 | C3 |
| Comp 112 | A2 | L2 | C3 |
| Comp 113 | A3 | L2 | C3 |
| Comp 114 | A4 | L2 | C3 |
| Comp 115 | A5 | L2 | C3 |
| Comp 116 | A6 | L2 | C3 |
| Comp 117 | A7 | L2 | C3 |
| Comp 118 | A8 | L2 | C3 |
| Comp 119 | A9 | L2 | C3 |
| Comp 120 | A10 | L2 | C3 |
| Comp 121 | A1 | L3 | C3 |
| Comp 122 | A2 | L3 | C3 |
| Comp 123 | A3 | L3 | C3 |
| Comp 124 | A4 | L3 | C3 |
| Comp 125 | A5 | L3 | C3 |
| Comp 126 | A6 | L3 | C3 |
| Comp 127 | A7 | L3 | C3 |
| Comp 128 | A8 | L3 | C3 |
| Comp 129 | A9 | L3 | C3 |
| Comp 130 | A10 | L3 | C3 |
| Comp 131 | A1 | L4 | C3 |
| Comp 132 | A2 | L4 | C3 |
| Comp 133 | A3 | L4 | C3 |
| Comp 134 | A4 | L4 | C3 |
| Comp 135 | A5 | L4 | C3 |
| Comp 136 | A6 | L4 | C3 |
| Comp 137 | A7 | L4 | C3 |
| Comp 138 | A8 | L4 | C3 |
| Comp 139 | A9 | L4 | C3 |
| Comp 140 | A10 | L4 | C3 |
| Comp 141 | A1 | L5 | C3 |
| Comp 142 | A2 | L5 | C3 |
| Comp 143 | A3 | L5 | C3 |
| Comp 144 | A4 | L5 | C3 |
| Comp 145 | A5 | L5 | C3 |
| Comp 146 | A6 | L5 | C3 |
| Comp 147 | A7 | L5 | C3 |
| Comp 148 | A8 | L5 | C3 |
| Comp 149 | A9 | L5 | C3 |
| Comp 150 | A10 | L5 | C3 |
| Comp 151 | A1 | L1 | C4 |
| Comp 152 | A2 | L1 | C4 |
| Comp 153 | A3 | L1 | C4 |
| Comp 154 | A4 | L1 | C4 |
| Comp 155 | A5 | L1 | C4 |
| Comp 156 | A6 | L1 | C4 |
| Comp 157 | A7 | L1 | C4 |
| Comp 158 | A8 | L1 | C4 |
| Comp 159 | A9 | L1 | C4 |
| Comp 160 | A10 | L1 | C4 |
| Comp 161 | A1 | L2 | C4 |
| Comp 162 | A2 | L2 | C4 |
| Comp 163 | A3 | L2 | C4 |
| Comp 164 | A4 | L2 | C4 |
| Comp 165 | A5 | L2 | C4 |
| Comp 166 | A6 | L2 | C4 |
| Comp 167 | A7 | L2 | C4 |
| Comp 168 | A8 | L2 | C4 |
| Comp 169 | A9 | L2 | C4 |
| Comp 170 | A10 | L2 | C4 |
| Comp 171 | A1 | L3 | C4 |
| Comp 172 | A2 | L3 | C4 |

TABLE 1-continued

| Comp # | A | L | C |
|---|---|---|---|
| Comp 173 | A3 | L3 | C4 |
| Comp 174 | A4 | L3 | C4 |
| Comp 175 | A5 | L3 | C4 |
| Comp 176 | A6 | L3 | C4 |
| Comp 177 | A7 | L3 | C4 |
| Comp 178 | A8 | L3 | C4 |
| Comp 179 | A9 | L3 | C4 |
| Comp 180 | A1 | L3 | C4 |
| Comp 181 | A1 | L4 | C4 |
| Comp 182 | A2 | L4 | C4 |
| Comp 183 | A3 | L4 | C4 |
| Comp 184 | A4 | L4 | C4 |
| Comp 185 | A5 | L4 | C4 |
| Comp 186 | A6 | L4 | C4 |
| Comp 187 | A7 | L4 | C4 |
| Comp 188 | A5 | L4 | C4 |
| Comp 189 | A9 | L4 | C4 |
| Comp 190 | A10 | L4 | C4 |
| Comp 191 | A1 | L5 | C4 |
| Comp 192 | A2 | L5 | C4 |
| Comp 193 | A3 | L5 | C4 |
| Comp 194 | A4 | L5 | C4 |
| Comp 195 | A5 | L5 | C4 |
| Comp 196 | A6 | L5 | C4 |
| Comp 197 | A7 | L5 | C4 |
| Comp 198 | A8 | L5 | C4 |
| Comp 199 | A9 | L5 | C4 |
| Comp 200 | A10 | L5 | C4 |

In some embodiments, the compound of formula I is:

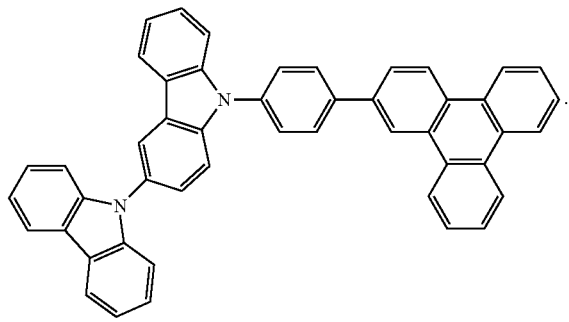

Comp 1

In some embodiments, a first device is provided. The first device comprises a first organic light emitting device, further comprising an anode, a cathode, and an organic layer disposed between the anode and the cathode, wherein the organic layer comprises a compound of the formula:

A-L-C (I).

In the compound of formula I, A has the formula:

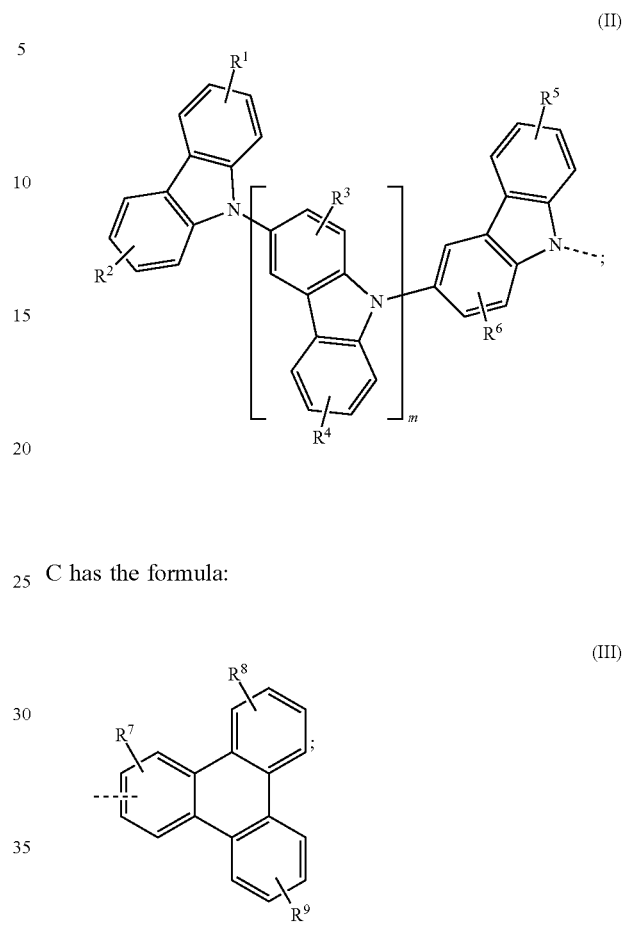

(II)

C has the formula:

(III)

L has the formula:

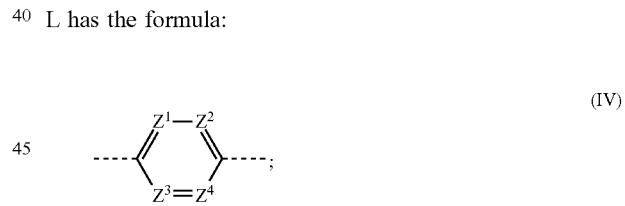

(IV)

$R^1$, $R^2$, $R^4$, $R^5$, $R^8$ and $R^9$ each independently represent mono, di, tri, tetra substitutions, or no substitution; $R^3$, $R^6$ and $R^7$ each independently represent mono, di, tri substitutions, or no substitution; m is an integer from 0 to 10; $R^1$, $R^2$, $R^3$, $R^4$, $R^5$, $R^6$, $R^7$, $R^8$ and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and $Z^1$, $Z^2$, $Z^3$ and $Z^4$ are each independently selected from the group consisting of N, CH and CD.

In some embodiments, the first device comprises a first organic light emitting device, further comprising an anode, a cathode, and an organic layer disposed between the anode and the cathode, wherein the organic layer comprises a compound of the formula:

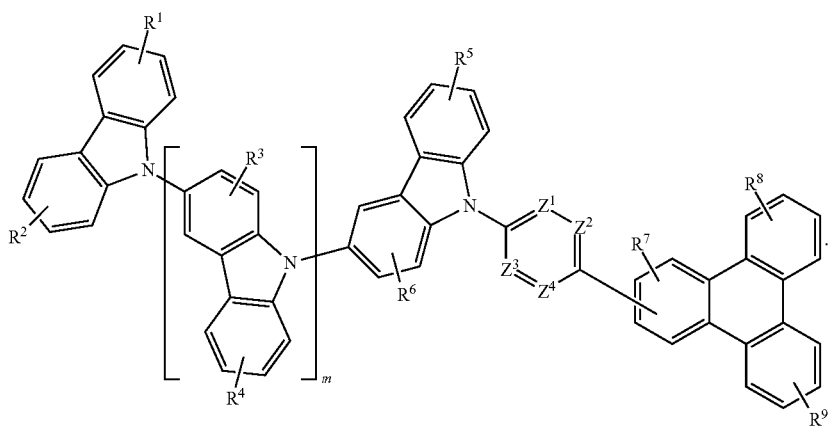

(I-A)

In the compound of formula I-A, $R^1$, $R^2$, $R^4$, $R^5$, $R^8$ and $R^9$ each independently represent mono, di, tri, tetra substitutions, or no substitution; $R^3$, $R^6$ and $R^7$ each independently represent mono, di, tri substitutions, or no substitution; m is an integer from 0 to 10; $R^1$, $R^2$, $R^3$, $R^4$, $R^5$, $R^6$, $R^7$, $R^8$ and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrite, isonitrile, sulfanyl, sulfinyl, sulfonyl, phosphino, and combinations thereof; and $Z^1$, $Z^2$, $Z^3$ and $Z^4$ are each independently selected from the group consisting of N, CH and CD.

In some embodiments, the organic layer of the device is an emissive layer and the compound of the formula I is a host.

In some embodiments, the organic layer of the device further comprises a phosphorescent emissive dopant.

In some embodiments, the phosphorescent emissive dopant of the device is a transition metal complex having at least one ligand or part of the ligand if the ligand is more than bidentate selected from the group consisting of:

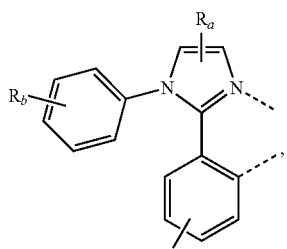

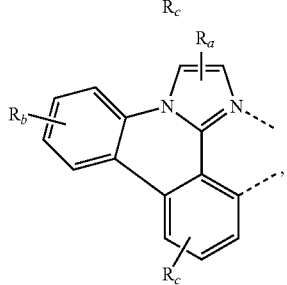

-continued

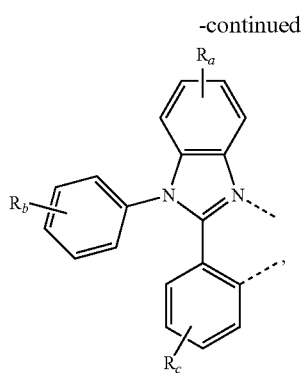

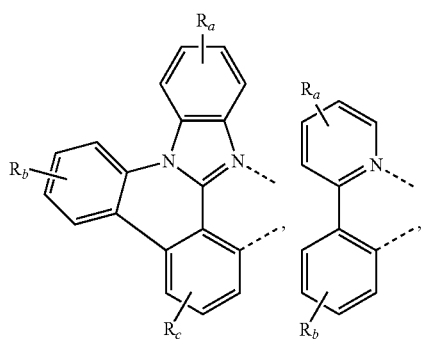

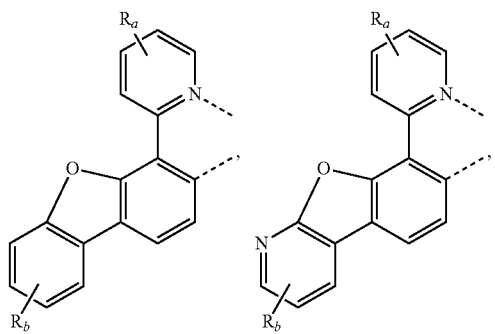

-continued

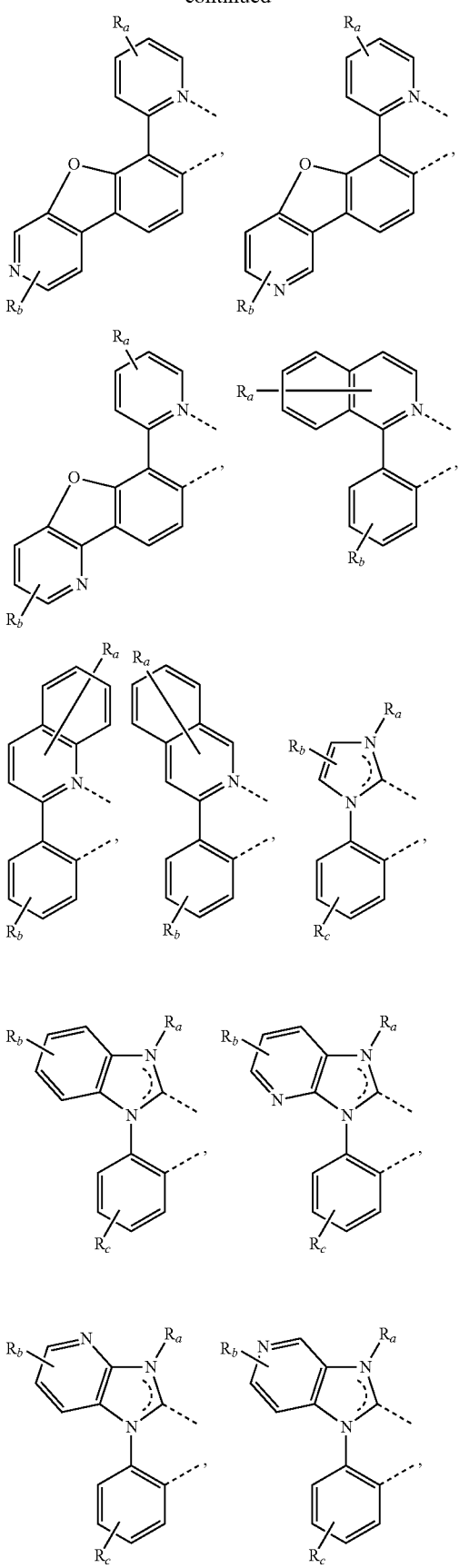
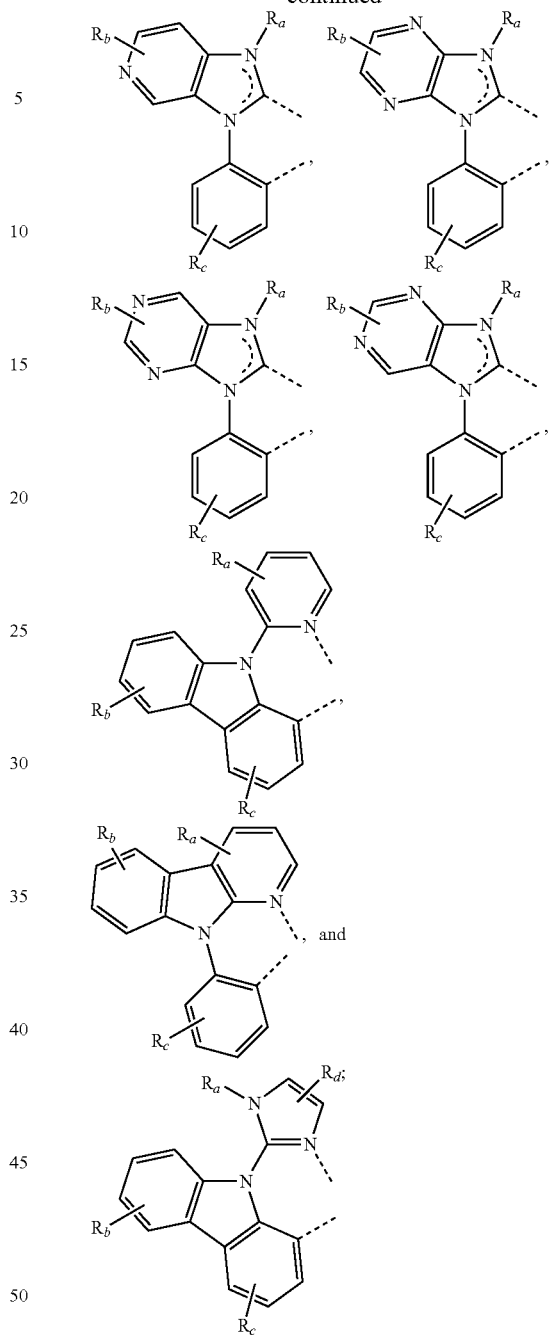

wherein $R_a$, $R_b$, $R_c$, and $R_d$ may represent mono, di, tai, or tetra substitution, or no substitution; wherein $R_a$, $R_b$, $R_c$, and $R_d$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R_a$, $R_b$, $R_c$, and $R_d$ are optionally joined to form a fused ring or form a multidentate ligand.

In some embodiments, the organic layer of the first device is a blocking layer and the compound is a blocking material in the organic layer.

In some embodiments, the first device is a consumer product. In some embodiments, the first device is an organic light-emitting device. In some embodiments, the first device comprises a lighting panel.

In some embodiments, the first device comprises the compound:

Comp 1

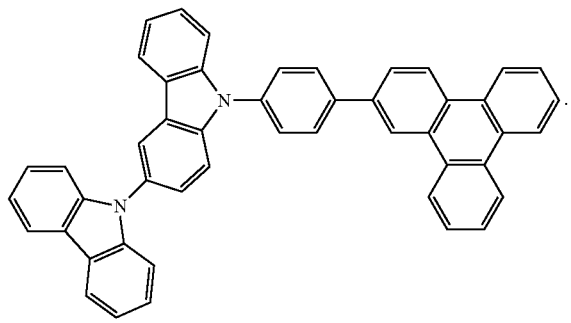

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

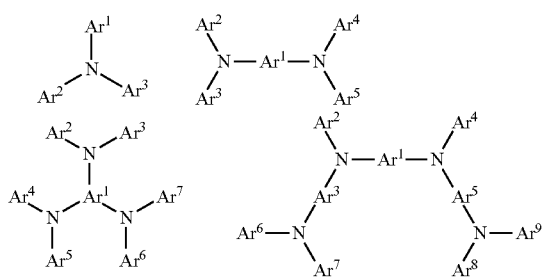

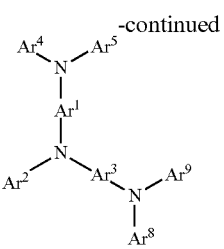

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, faran, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, $Ar^1$ to $Ar^9$ is independently selected from the group consisting of:

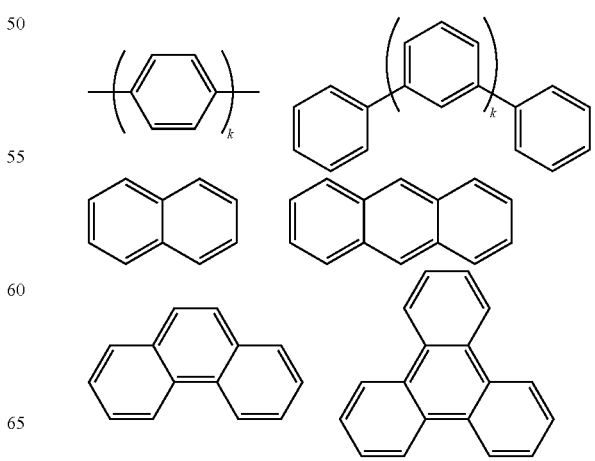

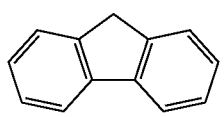 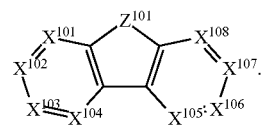

k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

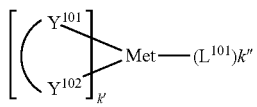

Met is a metal; $(Y^{101}\text{-}Y^{102})$ is a bidentate ligand, and $Y^{102}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, $(Y^{101}\text{-}Y^{102})$ is a 2-phenylpyridine derivative.

In some embodiments, $(Y^{101}\text{-}Y^{102})$ is a carbene ligand.

In some embodiments, Met is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

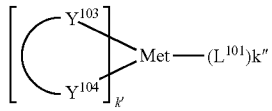

Met is a metal; $(Y^{103}\text{-}Y^{104})$ is a bidentate ligand, and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, the metal complexes are:

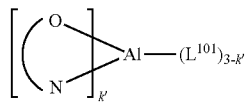 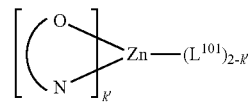

(O—N) is a bidentate ligand, having metal coordinated to atoms O and N.

In some embodiments, Met is selected from Ir and Pt.

In a further aspect, $(Y^{103}\text{-}Y^{104})$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atome, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, the host compound contains at least one of the following groups in the molecule:

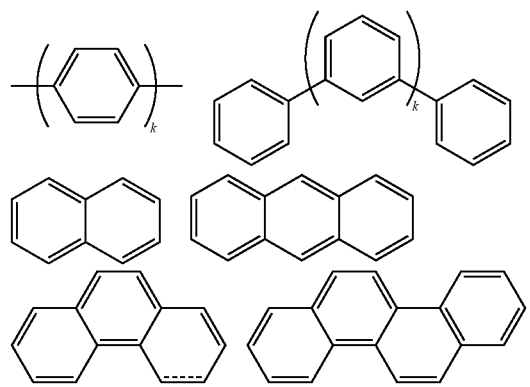

-continued

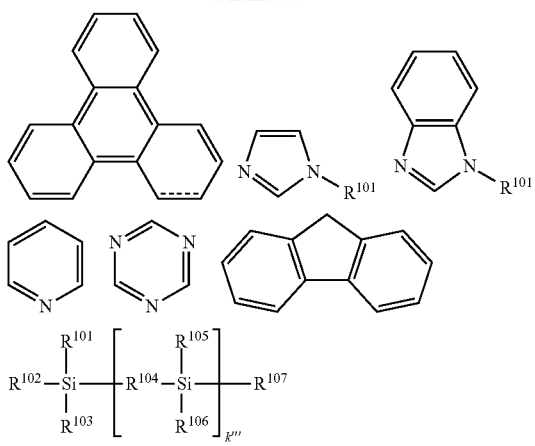

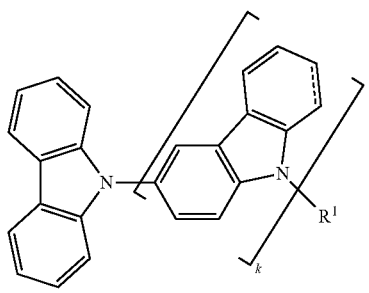

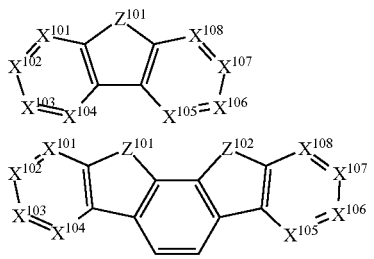

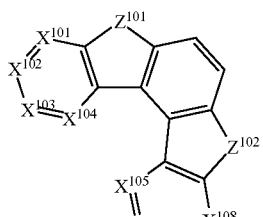

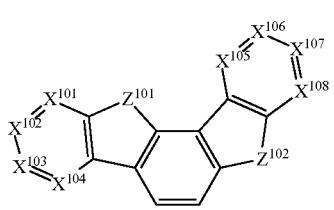

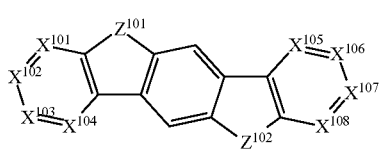

-continued

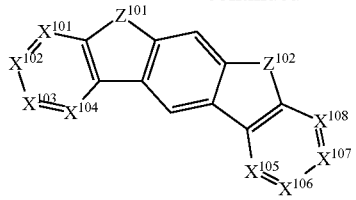

$R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

k is an integer from 1 to 20; k''' is an integer from 0 to 20.

$X^{101}$ to $X^{108}$ is selected from C (including CH) or N.

$Z^{101}$ and $Z^{102}$ are selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In some embodiments, compound used in HBL contains the same molecule or the same functional groups used as host described above.

In some embodiments, compound used in HBL contains at least one of the following groups in the molecule:

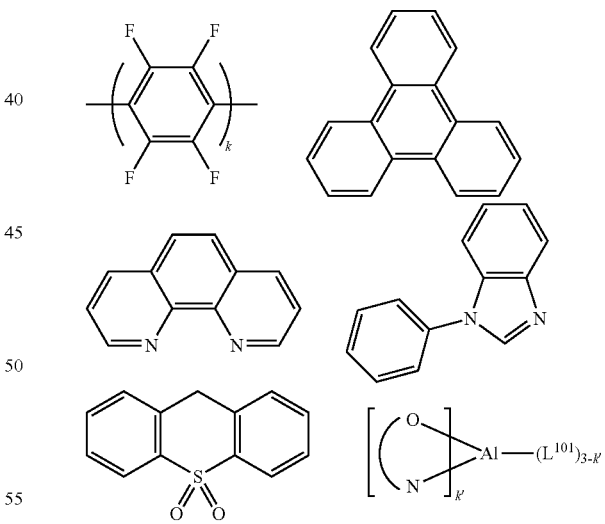

k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In some embodiments, compound used in ETL contains at least one of the following groups in the molecule:

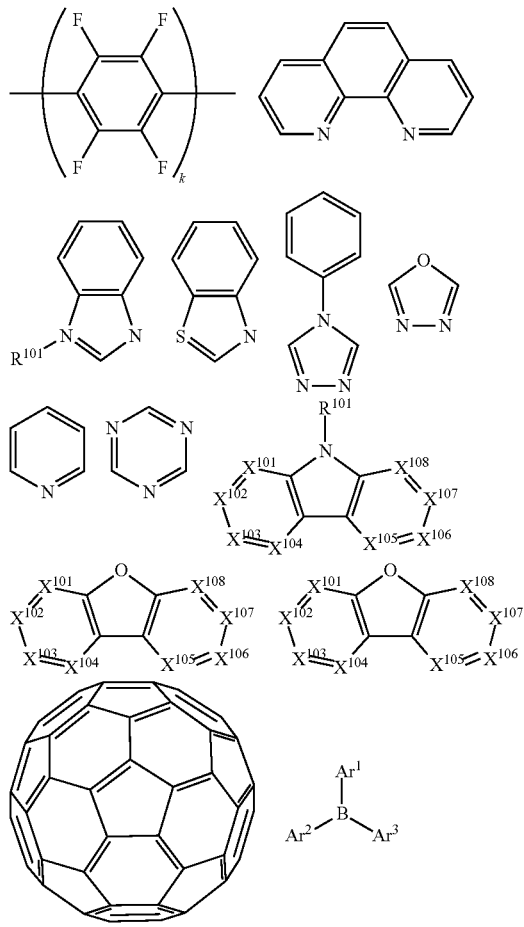

$R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 1 to 20.

$X^{101}$ to $X^{108}$ is selected from C (including CH) or N.

In some embodiments, the metal complexes used in ETL contains, but not limit to the following general formula:

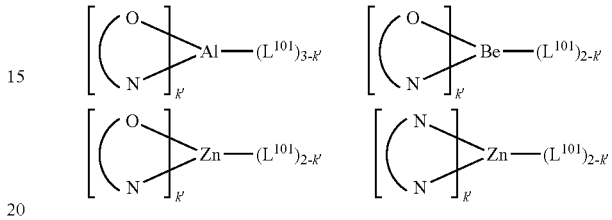

(O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in TABLE 2 below. TABLE 2 lists non-limiting classes of materials, non-limiting examples of compounds for each class, and references that disclose the materials.

TABLE 2

| MATERIAL | EXAMPLES OF MATERIAL | PUBLICATIONS |
| --- | --- | --- |
| | Hole injection materials | |
| Phthalocyanine and porphryin compounds | | Appl. Phys. Lett. 69, 2160 (1996) |

TABLE 2-continued

| MATERIAL | EXAMPLES OF MATERIAL | PUBLICATIONS |
| --- | --- | --- |
| Starburst triarylamines | (structure) | J. Lumin. 72-74, 985 (1997) |
| $CF_x$ Fluorohydrocarbon polymer | $-\!\!-\!\!(CH_xF_y)_n\!\!-\!\!-$ | Appl. Phys. Lett. 78, 673 (2001) |
| Conducting polymers (e.g., PEDOT:PSS, polyaniline, polypthiophene) | (structure) | Synth. Met. 87, 171 (1997) WO2007002683 |
| Phosphonic acid and silane SAMs | (structure) | US20030162053 |
| Triarylamine or polythiophene polymers with conductivity dopants | (structure) and | EP1725079A1 |

TABLE 2-continued
| MATERIAL | EXAMPLES OF MATERIAL | PUBLICATIONS |
|---|---|---|
| | 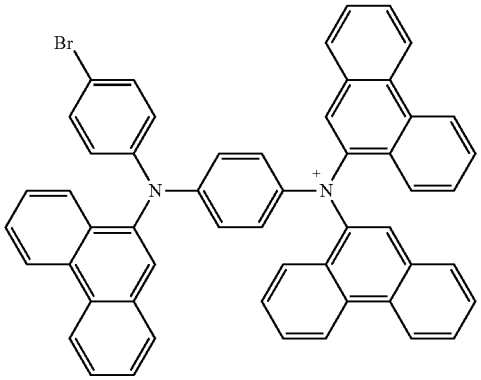 [SMILES: Brc1ccc(N(c2ccc(N(c3cc4ccccc4c4ccccc34)c3cc4ccccc4c4ccccc34)cc2)c2cc3ccccc3c3ccccc23)cc1] | |
| | 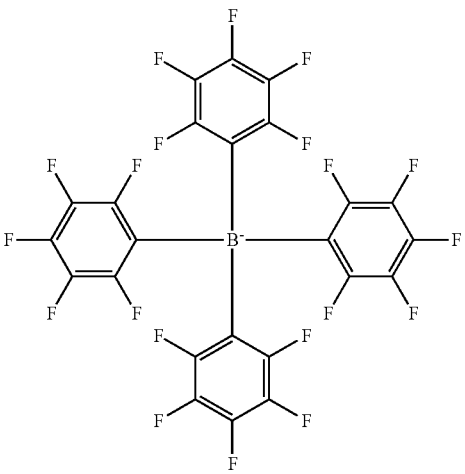 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | |
| Organic compounds with conductive inorganic compounds, such as molybdenum and tungsten oxides | 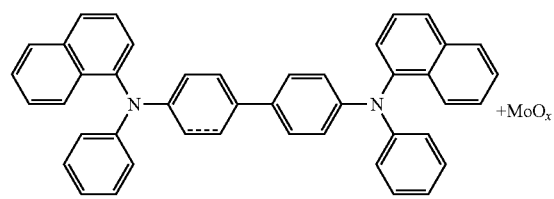 | US20050123751 SID Symposium Digest, 37, 923 (2006) WO2009018009 |
| n-type semiconducting organic complexes | 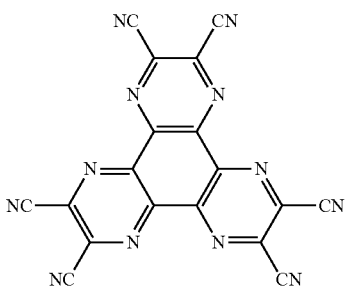 [SMILES: N#Cc1nc2c3nc(C#N)c(C#N)nc3c3nc(C#N)c(C#N)nc3c2nc1C#N] | US20020158242 |
| Metal organometallic complexes | 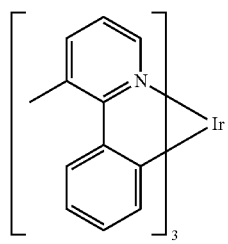 | US20060240279 |

TABLE 2-continued
| MATERIAL | EXAMPLES OF MATERIAL | PUBLICATIONS |
|---|---|---|
| Cross-linkable compounds | 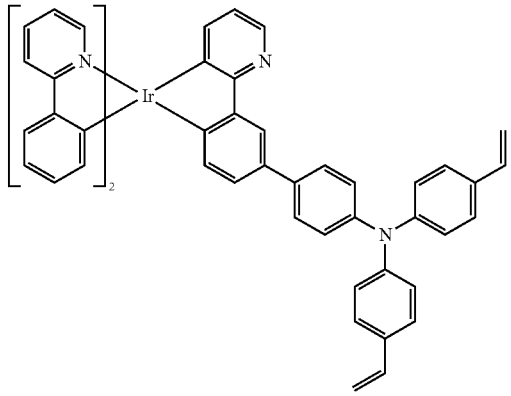 | US20080220265 |
| Polythiophene based polymers and copolymers | 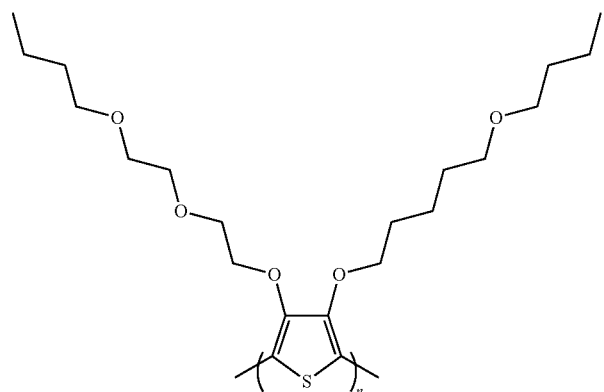 | WO 2011075644<br>EP2350216 |
| Hole transporting materials | | |
| Triarylamines (e.g., TPD, □-NPD) | 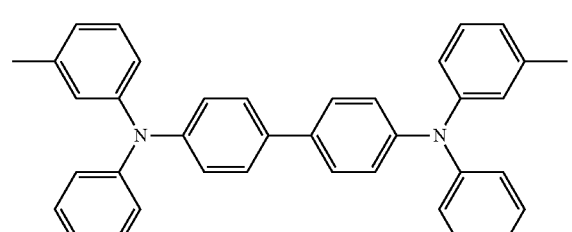 | Appl. Phys. Lett. 51, 913 (1987) |
| | 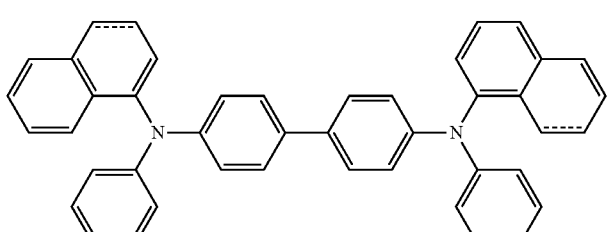 | U.S. Pat. No. 5,061,569 |

TABLE 2-continued
| MATERIAL | EXAMPLES OF MATERIAL | PUBLICATIONS |
|---|---|---|
| | 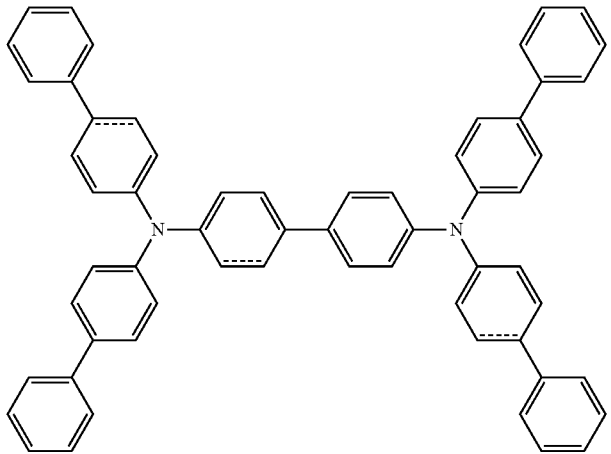 | EP650955 |
| | 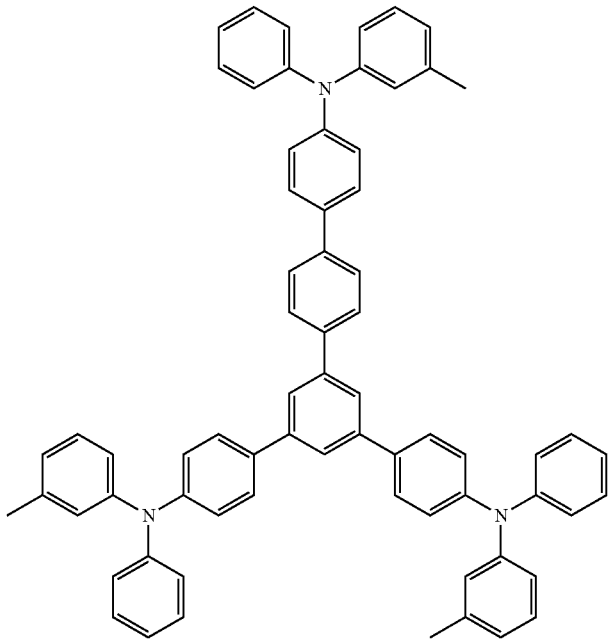 [SMILES: Cc1cccc(N(c2ccccc2)c2ccc(-c3ccc(-c4cc(-c5ccc(N(c6ccccc6)c6cccc(C)c6)cc5)cc(-c5ccc(N(c6ccccc6)c6cccc(C)c6)cc5)c4)cc3)cc2)c1] | J. Mater. Chem. 3, 319 (1993) |
| | 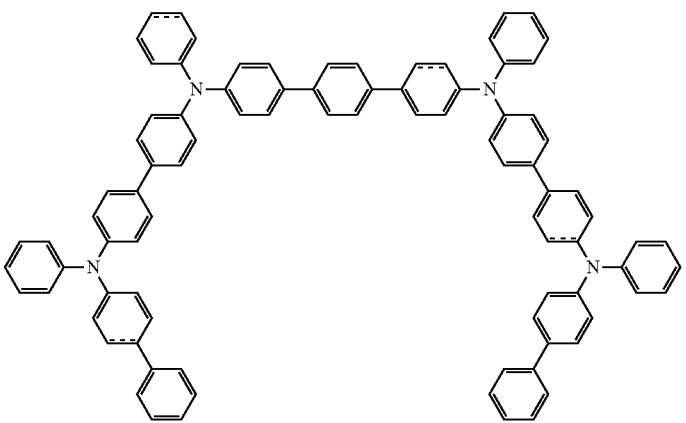 | Appl. Phys. Lett. 90, 183503 (2007) |

TABLE 2-continued
| MATERIAL | EXAMPLES OF MATERIAL | PUBLICATIONS |
|---|---|---|
| | 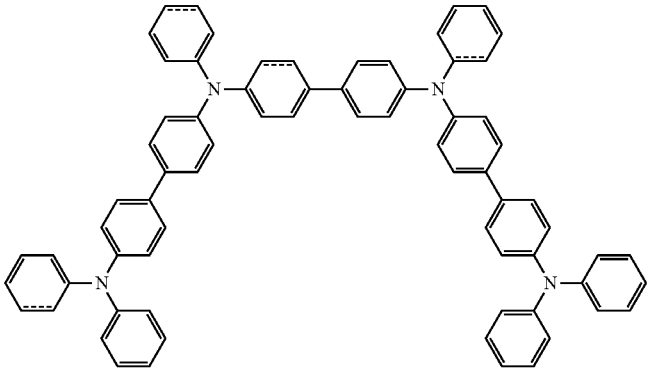 | Appl. Phys. Lett. 90, 183503 (2007) |
| Triaylamine on spirofluorene core | 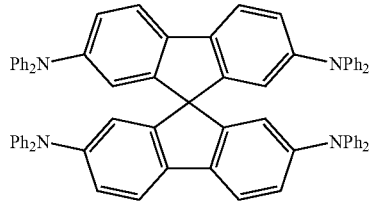 | Synth. Met. 91, 209 (1997) |
| Arylamine carbazole compounds | 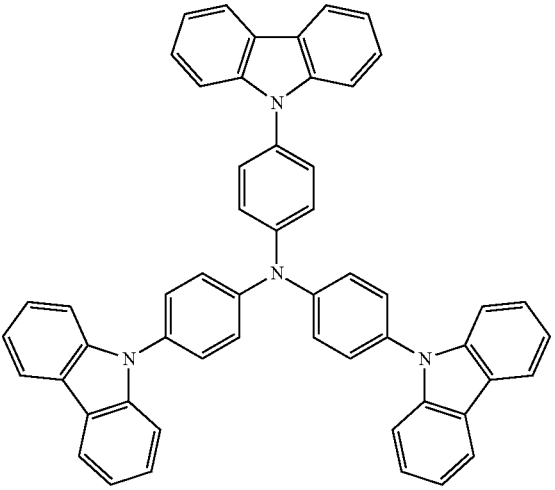 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |
| Triarylamine with (di)benzothiophene/ (di) benzofuran | 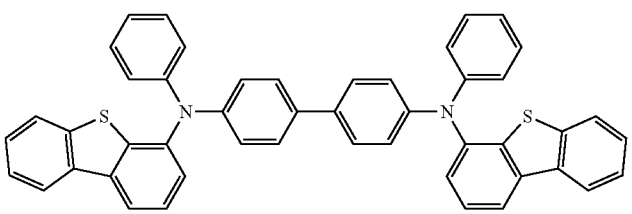 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |

TABLE 2-continued

| MATERIAL | EXAMPLES OF MATERIAL | PUBLICATIONS |
| --- | --- | --- |
| Indolocarbazoles | | Synth. Met. 111, 421 (2000) |
| Isoindole compounds | | Chem. Mater. 15, 3148 (2003) |
| Metal carbene complexes | | US20080018221 |

Phosphorescent OLED host materials
Red hosts

| | | |
| --- | --- | --- |
| Arylcarbazoles | | Appl. Phys. Lett. 78, 1622 (2001) |

TABLE 2-continued

| MATERIAL | EXAMPLES OF MATERIAL | PUBLICATIONS |
| --- | --- | --- |
| Metal 8-hydroxyquinolates (e.g., Alq$_3$, BAlq) | | Nature 395, 151 (1998) |
| | | US20060202194 |
| | | WO2005014551 |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |

TABLE 2-continued

| MATERIAL | EXAMPLES OF MATERIAL | PUBLICATIONS |
|---|---|---|
| Zinc complexes | | WO2010056066 |
| Chrysene based compounds | | WO2011086863 |

Green hosts

| | | |
|---|---|---|
| Arylcarbazoles | | Appl. Phys. Lett. 78, 1622 (2001) |
| | | US20030175553 |
| | | WO2001039234 |
| Aryltriphenylene compounds | | US20060280965 |

TABLE 2-continued
| MATERIAL | EXAMPLES OF MATERIAL | PUBLICATIONS |
|---|---|---|
| | 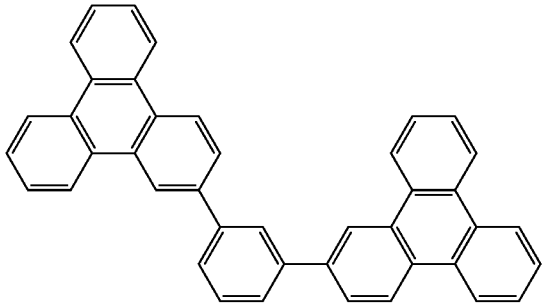 [SMILES: c1cc(-c2ccc3c4ccccc4c4ccccc4c3c2)cc(-c2ccc3c4ccccc4c4ccccc4c3c2)c1] | US20060280965 |
| | 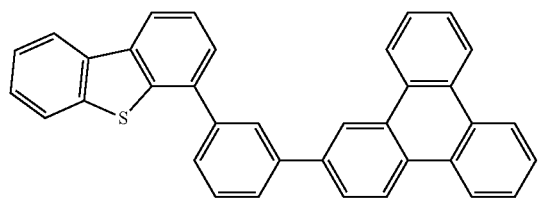 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 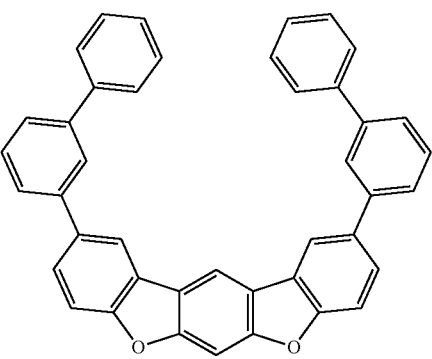 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 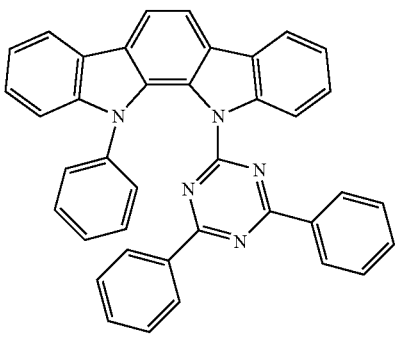 [SMILES: c1ccc(-c2nc(-c3ccccc3)nc(-n3c4ccccc4c4ccc5c6ccccc6n(-c6ccccc6)c5c43)n2)cc1] | WO2008056746 |
| | 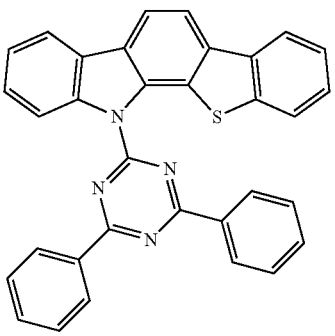 [SMILES: c1ccc(-c2nc(-c3ccccc3)nc(-n3c4ccccc4c4ccc5c6ccccc6sc5c43)n2)cc1] | WO2010107244 |

TABLE 2-continued

| MATERIAL | EXAMPLES OF MATERIAL | PUBLICATIONS |
|---|---|---|
| Aza-carbazole/ DRT/DBF | | JP2008074939 |
| | | US20100187984 |
| Polymers (e.g., PVK) | | Appl. Phys. Lett. 77, 2280 (2000) |
| Spirofluorene compounds | | WO2004093207 |
| Metal phenoxybenzooxazole compounds | | WO2005089025 |

TABLE 2-continued

| MATERIAL | EXAMPLES OF MATERIAL | PUBLICATIONS |
|---|---|---|
| | | WO2006132173 |
| | | JP200511610 |
| Spirofluorene-carbazole compounds | | JP2007254297 |
| | | JP2007254297 |
| Indolocabazoles | | WO2007063796 |

TABLE 2-continued
| MATERIAL | EXAMPLES OF MATERIAL | PUBLICATIONS |
|---|---|---|
| | 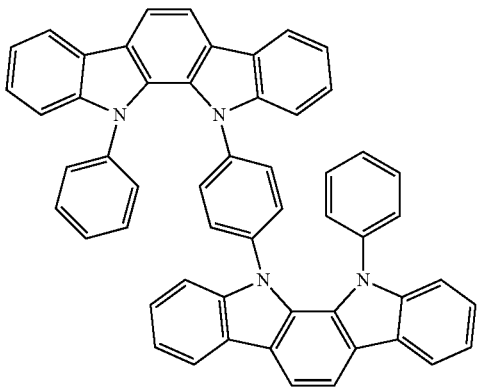 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 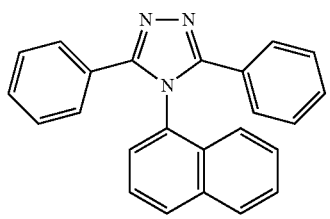 [SMILES: c1ccc(-c2nnc(-c3ccccc3)n2-c2cccc3ccccc23)cc1] | J. Appl. Phys. 90, 5048 (2001) |
| | 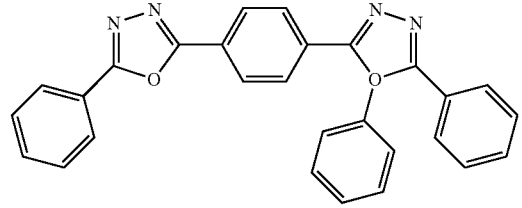 | WO2004107822 |
| Tetraphenylene complexes | 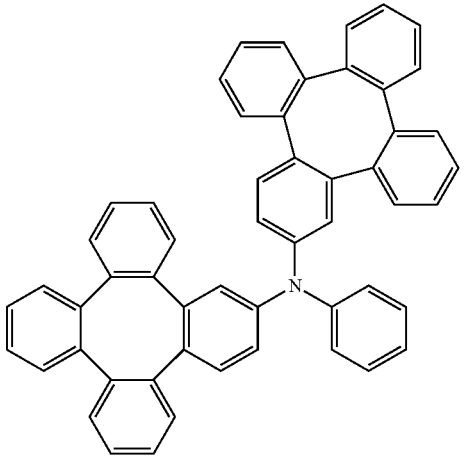 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |
| Metal phenoxypyridine compounds | 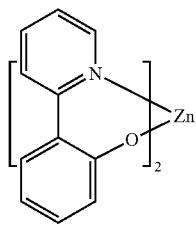 | WO2005030900 |

TABLE 2-continued

| MATERIAL | EXAMPLES OF MATERIAL | PUBLICATIONS |
|---|---|---|
| Metal coordination complexes (e.g., Zn, Al with N^N ligands) | | US20040137268, US20040137267 |

Blue hosts

| | | |
|---|---|---|
| Arylcarbazoles | | Appl. Phys. Lett 82, 2422 (2003) |
| | | US20070190359 |
| Dibenzothiophene/ Dibenzofuran-carbazole compounds | | WO2006114966, US20090167162 |
| | | US20090167162 |
| | | WO2009086028 |

TABLE 2-continued
| MATERIAL | EXAMPLES OF MATERIAL | PUBLICATIONS |
|---|---|---|
| | 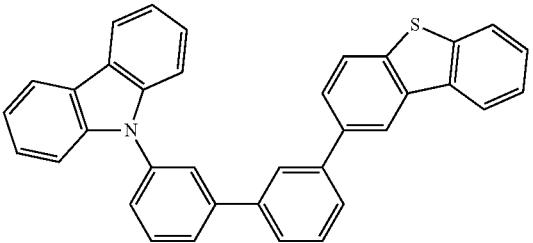 [SMILES: c1cc(-c2cccc(-n3c4ccccc4c4ccccc43)c2)cc(-c2ccc3sc4ccccc4c3c2)c1] | US20090030202, US20090017330 |
| | 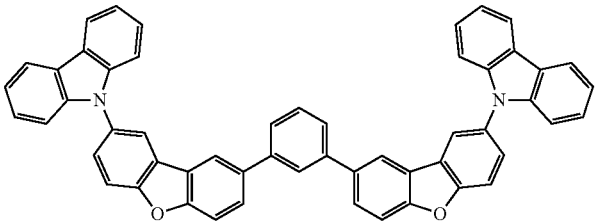 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 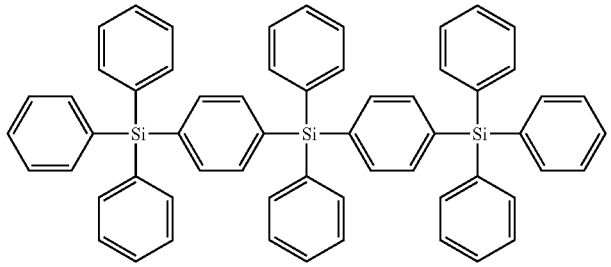 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 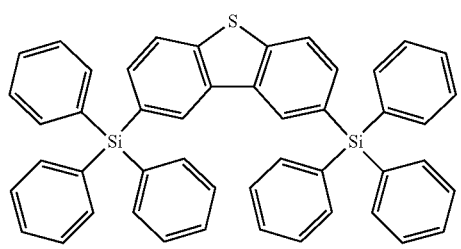 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |
| Silicon/Germanium aryl compounds | 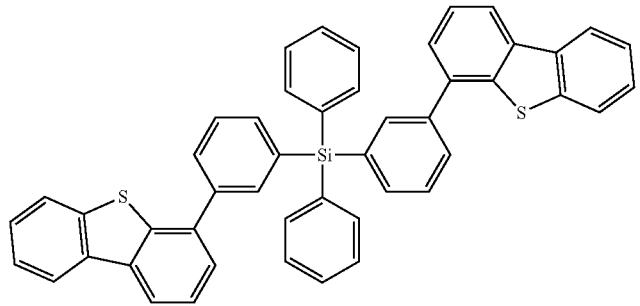 [SMILES: c1ccc([Si](c2ccccc2)(c2cccc(-c3cccc4c3sc3ccccc34)c2)c2cccc(-c3cccc4c3sc3ccccc34)c2)cc1] | EP2034538A |
| Aryl benzoyl ester | 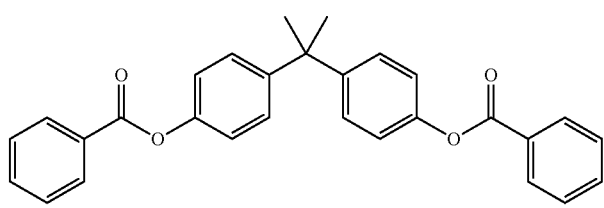 [SMILES: CC(C)(c1ccc(OC(=O)c2ccccc2)cc1)c1ccc(OC(=O)c2ccccc2)cc1] | WO2006100298 |

TABLE 2-continued

| MATERIAL | EXAMPLES OF MATERIAL | PUBLICATIONS |
|---|---|---|
| Carbazole linked by non-conjugated groups | | US20040115476 |
| Aza-carbazoles | | US20060121308 |
| High triplet metal organometallic complex | | U.S. Pat. No. 7,154,114 |

Phosphorescent dopants
Red dopants

| | | |
|---|---|---|
| Heavy metal porphyrins (e.g., PtOEP) | | Nature 395, 151 (1998) |
| Iridium(III) organometallic complexes | | Appl. Phys. Lett. 78, 1622 (2001) |

| MATERIAL | EXAMPLES OF MATERIAL | PUBLICATIONS |
|---|---|---|
| | | US2006835469 |
| | | US2006835469 |
| | | US20060202194 |
| | | US20060202194 |
| | | US20070087321 |

TABLE 2-continued

| MATERIAL | EXAMPLES OF MATERIAL | PUBLICATIONS |
|---|---|---|
| | | US20080261076<br>US20100090591 |
| | | US20070087321 |
| | | Adv. Mater. 19, 739 (2007) |
| | | WO2009100991 |
| | | WO2008101842 |

TABLE 2-continued

| MATERIAL | EXAMPLES OF MATERIAL | PUBLICATIONS |
|---|---|---|
| | (structure) | U.S. Pat. No. 7,232,618 |
| Platinum(II) organometallic complexes | (structure) | WO2003040257 |
| | (structure) | US20070103060 |
| Osminum(III) complexes | (structure) | Chem. Mater. 17, 3532 (2005) |
| Ruthenium(II) complexes | (structure) | Adv. Mater. 17, 1059 (2005) |
| Rhenium (I), (II), and (III) complexes | (structure) | US20050244673 |

TABLE 2-continued
| MATERIAL | EXAMPLES OF MATERIAL | PUBLICATIONS |
| --- | --- | --- |
| | Green dopants | |
| Iridium(III) organometallic complexes | 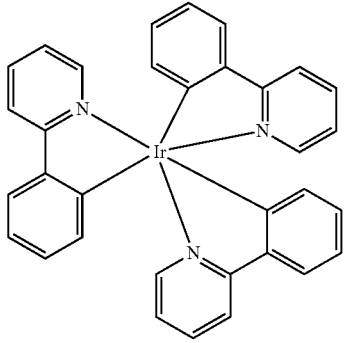 and its derivatives | Inorg. Chem. 40, 1704 (2001) |
| | 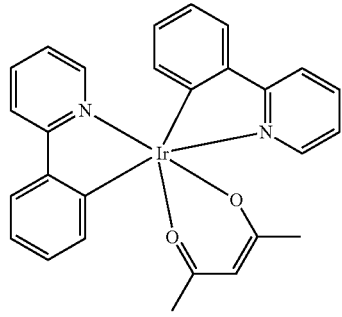 | US20020034656 |
| | 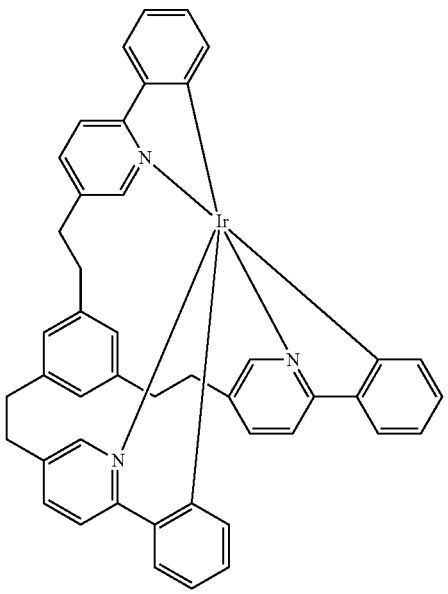 | U.S. Pat. No. 7,332,232 |

TABLE 2-continued
| MATERIAL | EXAMPLES OF MATERIAL | PUBLICATIONS |
|---|---|---|
| | 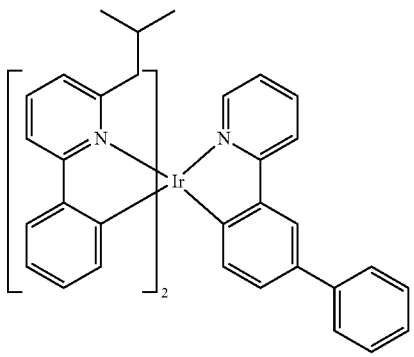 | US20090108737 |
| | 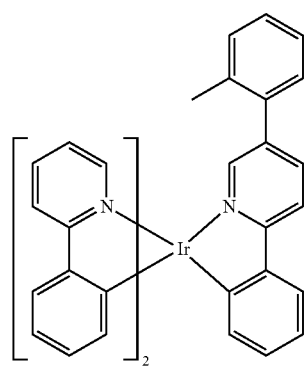 | WO2010028151 |
| | 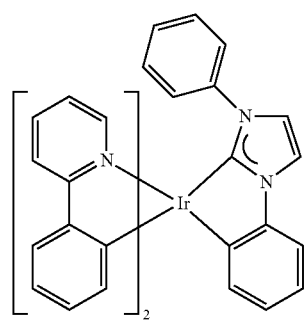 | EP1841834B |
| | 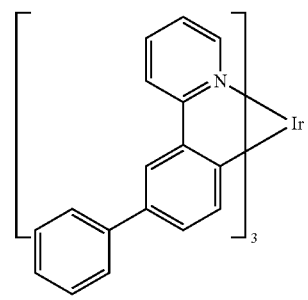 | US20060127696 |
| | 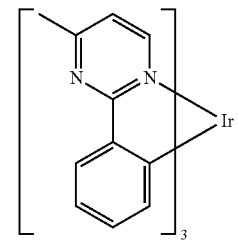 | US20090039776 |

TABLE 2-continued

| MATERIAL | EXAMPLES OF MATERIAL | PUBLICATIONS |
|---|---|---|
| | | U.S. Pat. No. 6,921,915 |
| | | US20100244004 |
| | | U.S. Pat. No. 6,687,266 |
| | | Chem. Mater. 16, 2480 (2004) |
| | | US20070190359 |

TABLE 2-continued

| MATERIAL | EXAMPLES OF MATERIAL | PUBLICATIONS |
|---|---|---|
| | | US 20060008670<br>JP2007123392 |
| | | WO2010086089,<br>WO2011044988 |
| | | Adv. Mater. 16,<br>2003 (2004) |
| | | Angew. Chem.<br>Int. Ed.<br>2006, 45, 7800 |
| | | WO2009050290 |
| | | US20090165846 |

TABLE 2-continued

| MATERIAL | EXAMPLES OF MATERIAL | PUBLICATIONS |
|---|---|---|
| | (structure) | US20080015355 |
| | (structure) | US20010015432 |
| | (structure) | US20100295032 |
| Monomer for polymeric metal organometallic compounds | (structure) | U.S. Pat. No. 7,250,226, U.S. Pat. No. 7,396,598 |
| Pt(II) organometallic complexes, including polydentated ligands | (structure) | Appl. Phys. Lett, 153505 (2005) |

TABLE 2-continued
| MATERIAL | EXAMPLES OF MATERIAL | PUBLICATIONS |
|---|---|---|
| | 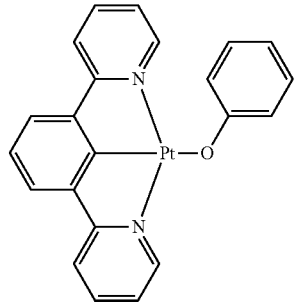 | Appl. Phys. Lett. 86, 153505 (2005) |
| | 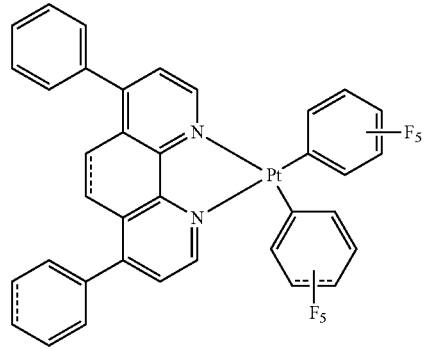 | Chem. Lett. 34, 592 (2005) |
| | 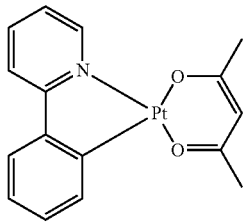 | WO2002015645 |
| | 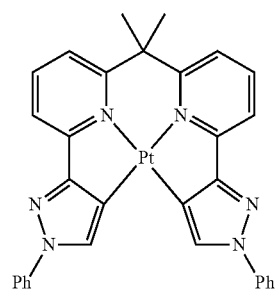 | US20060263635 |
| | 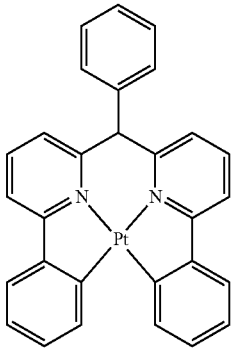 | US20060182992 US20070103060 |

TABLE 2-continued
| MATERIAL | EXAMPLES OF MATERIAL | PUBLICATIONS |
|---|---|---|
| Cu complexes | 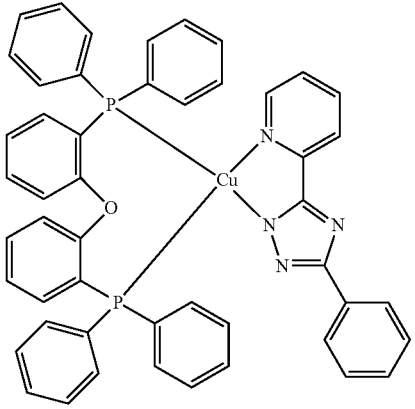 | WO2009000673 |
| | 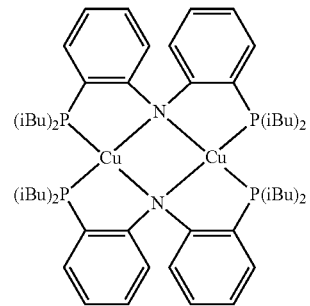 | US20070111026 |
| Gold complexes | 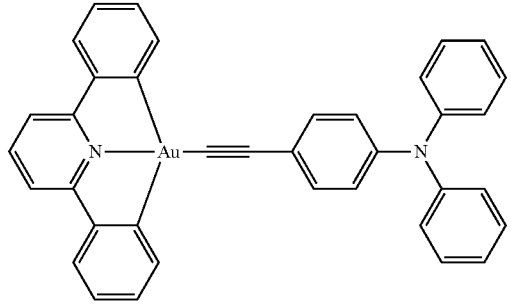 | Chem. Commun. 2906 (2005) |
| Rhenium(III) complexes | 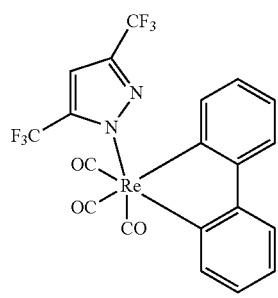 | Inorg. Chem. 42, 1248 (2003) |

TABLE 2-continued

| MATERIAL | EXAMPLES OF MATERIAL | PUBLICATIONS |
| --- | --- | --- |
| Osmium(II) complexes | | U.S. Pat. No. 7,279,704 |
| Deuterated organometallic complexes | | US20030138657 |
| Organometallic complexes with two or more metal centers | | US20030152802 |
| | | U.S. Pat. No. 7,090,928 |

TABLE 2-continued
| MATERIAL | EXAMPLES OF MATERIAL | PUBLICATIONS |
|---|---|---|
| | Blue dopants | |
| Iridium(III) organometallic complexes | 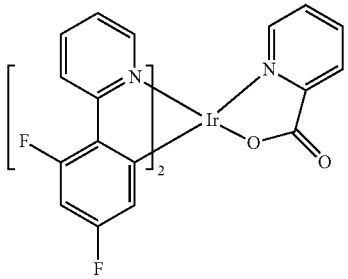 | WO2002002714 |
| | 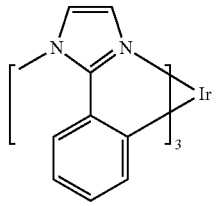 | WO2006009024 |
| | 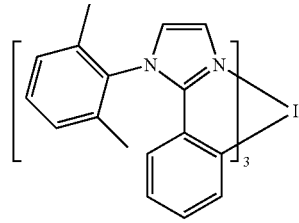 | US20060251923<br>US20110057559<br>US20110204333 |
| | 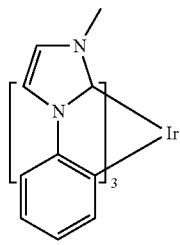 | U.S. Pat. No. 7,393,599,<br>WO2006056418,<br>US20050260441,<br>WO2005019373 |
| | 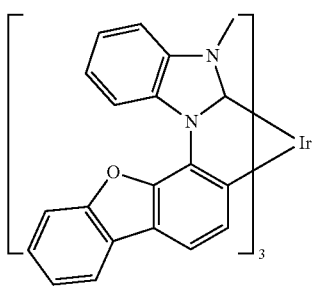 | U.S. Pat. No. 7,534,505 |

TABLE 2-continued
| MATERIAL | EXAMPLES OF MATERIAL | PUBLICATIONS |
|---|---|---|
| | 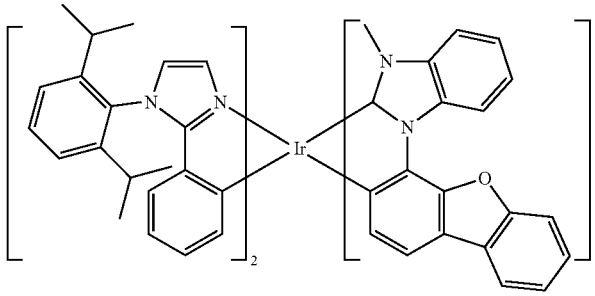 | WO2011051404 |
| | 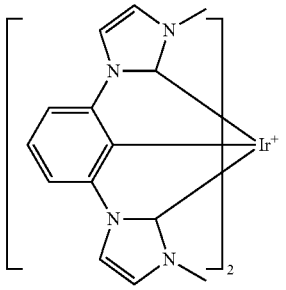 | U.S. Pat. No. 7,445,855 |
| | 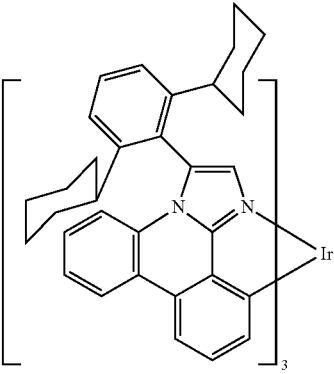 | US20070190359, US20080297033 US20100148663 |
| | 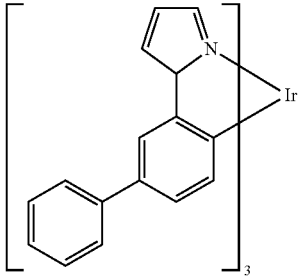 | U.S. Pat. No. 7,338,722 |
| | 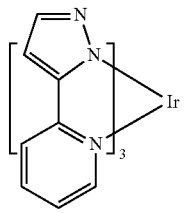 | US20020134984 |

TABLE 2-continued

| MATERIAL | EXAMPLES OF MATERIAL | PUBLICATIONS |
|---|---|---|
| | | Angew. Chem. Int. Ed. 47, 4542 (2008) |
| | | Chem. Mater. 18, 5119 (2006) |
| | | Inorg. Chem. 46, 4308 (2007) |
| | | WO2005123873 |
| | | WO2005123873 |

TABLE 2-continued
| MATERIAL | EXAMPLES OF MATERIAL | PUBLICATIONS |
|---|---|---|
| | 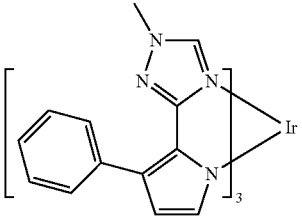 | WO2007004380 |
| | 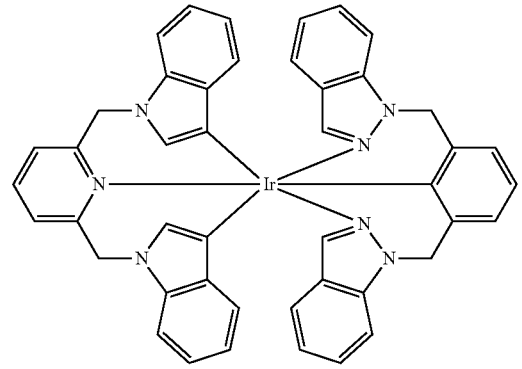 | WO2006082742 |
| Osmium(II) complexes | 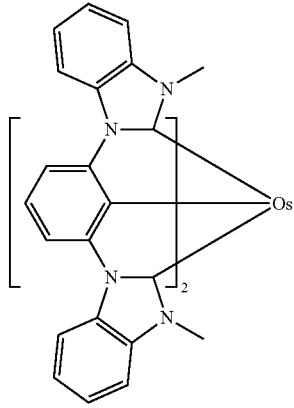 | U.S. Pat. No. 7,279,704 |
| | 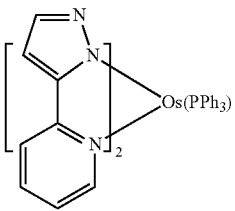 | Organometallics 23, b3745 (2004) |
| Gold complexes | 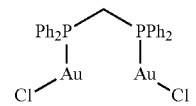 | Appl. Phys. Lett. 74, 1361 (1999) |
| Platinum(II) complexes | 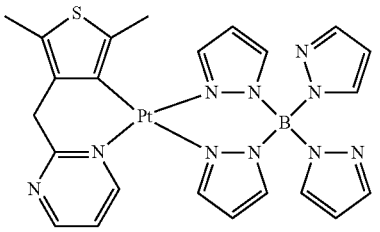 | WO2006098120, WO2006103874 |

TABLE 2-continued

| MATERIAL | EXAMPLES OF MATERIAL | PUBLICATIONS |
|---|---|---|
| Pt tetradentate complexes with at least one metal-carbene bond | | U.S. Pat. No. 7,655,323 |
| Exciton/hole blocking layer materials | | |
| Bathocuprine compounds (e.g., BCP, BPhen) | | Appl. Phys. Lett. 75, 4 (1999) |
| | | Appl. Phys. Lett. 79, 449 (2001) |
| Metal 8-hydroxyquinolates (e.g., BAlq) | | Appl. Phys. Lett. 81, 162 (2002) |
| 5-member ring electron deficient heterocycles such as triazole, oxadiazole, imidazole, benzoimidazole | | Appl. Phys. Lett. 81, 162 (2002) |

TABLE 2-continued
| MATERIAL | EXAMPLES OF MATERIAL | PUBLICATIONS |
|---|---|---|
| Triphenylene compounds | 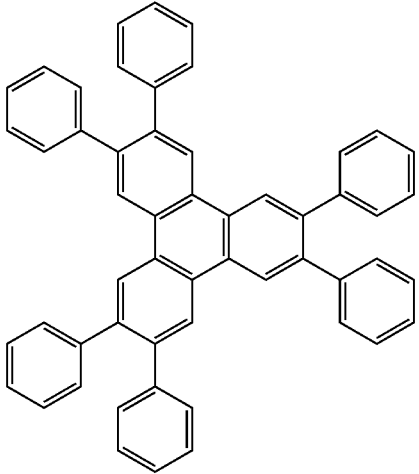 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 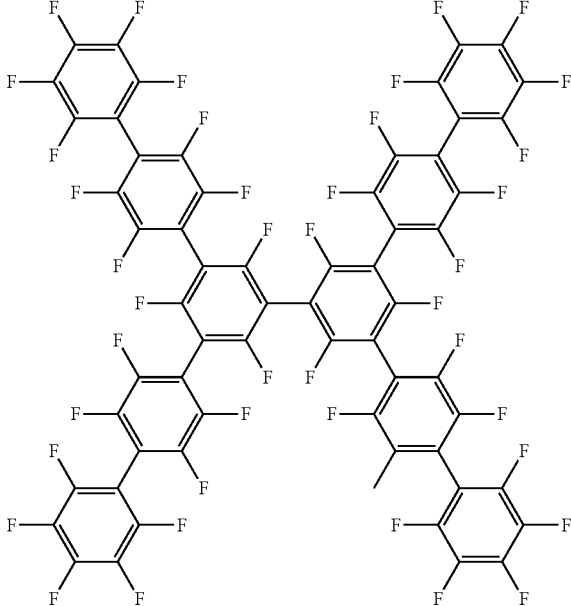 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 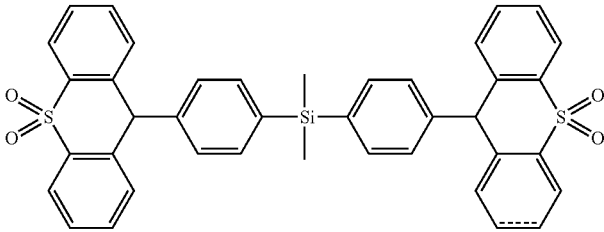 | WO2008132085 |
| Silylated five-membered nitrogen, oxygen, sulfur or phosphorus dibenzoheterocycles | 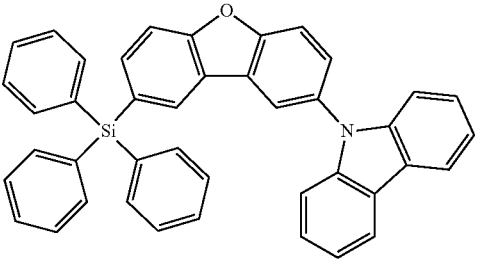 [SMILES: c1ccc([Si](c2ccccc2)(c2ccccc2)c2ccc3oc4ccc(-n5c6ccccc6c6ccccc65)cc4c3c2)cc1] | WO2010079051 |

TABLE 2-continued
| MATERIAL | EXAMPLES OF MATERIAL | PUBLICATIONS |
|---|---|---|
| Aza-carbazoles | 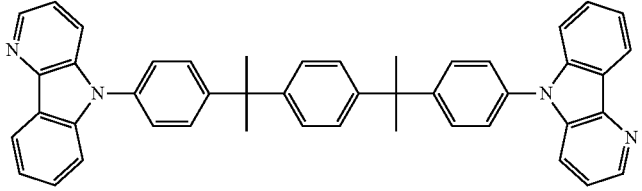 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| Electron transporting materials | | |
| Anthracene-benzoimidazole compounds | 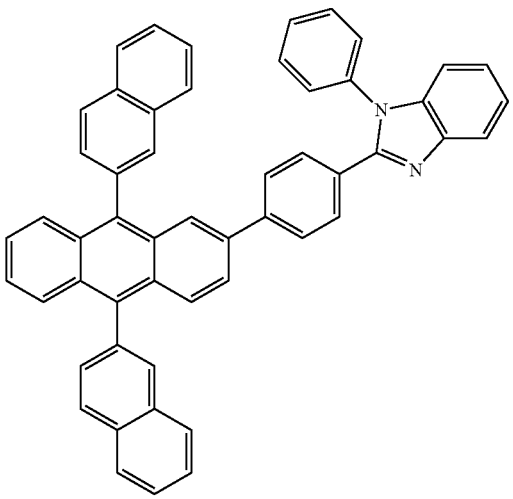 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 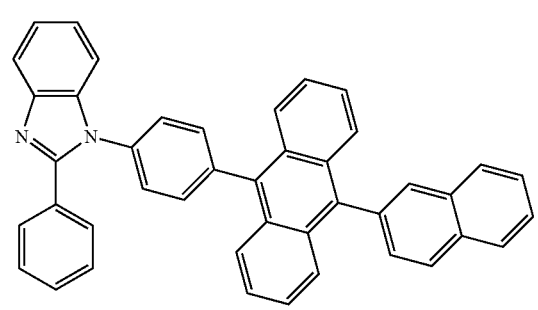 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 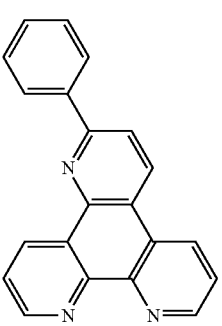 [SMILES: c1ccc(-c2ccc3c4cccnc4c4ncccc4c3n2)cc1] | US20090115316 |
| Anthracene-benzothiazole compounds | 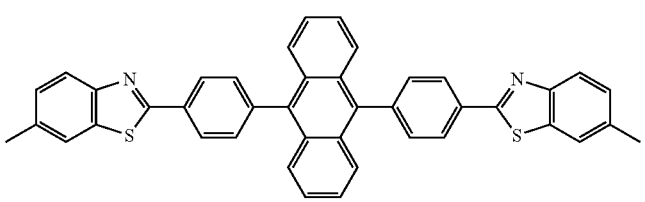 | Appl. Phys. Lett. 89, 063504 (2006) |

TABLE 2-continued

| MATERIAL | EXAMPLES OF MATERIAL | PUBLICATIONS |
| --- | --- | --- |
| Metal 8-hydroxyquinolates (e.g., $Alq_3$, $Zrq_4$) | | Appl. Phys. Lett. 51, 913 (1987) U.S. Pat. No. 7,230,107 |
| Metal hydroxybenoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |
| 5-member ring electron deficient heterocycles (e.g., triazole, oxadiazole, imidazole, benzoimidazole) | | Appl. Phys. Lett. 74, 865 (1999) |
| | | Appl, Phys, Lett. 55, 1489 (1989) |

TABLE 2-continued
| MATERIAL | EXAMPLES OF MATERIAL | PUBLICATIONS |
|---|---|---|
| | 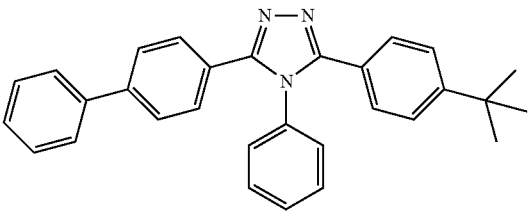 [SMILES: CC(C)(C)c1ccc(-c2nnc(-c3ccc(-c4ccccc4)cc3)n2-c2ccccc2)cc1] | Jpn, J. Apply. Phys. 32, L917 (1993) |
| Silole compounds | 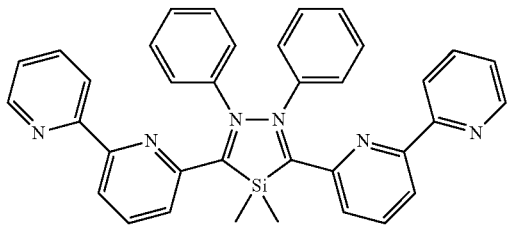 | Org. Electron. 4, 113 (2003) |
| Arylborane compounds | 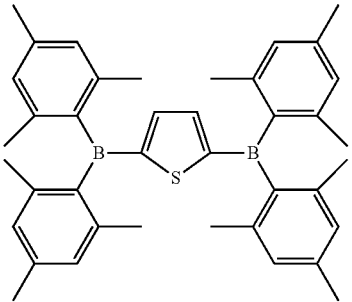 | J. Am. Chem. Soc. 120, 9714 (1998) |
| Fluorinated aromatic compounds | 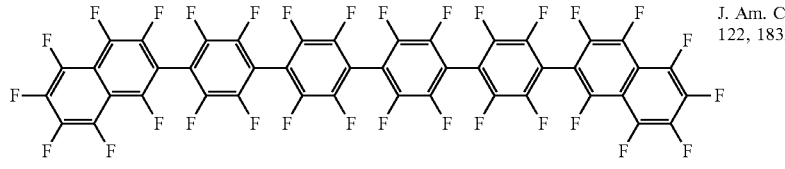 | J. Am. Chem. Soc. 122, 1832 (2000) |
| Fullerene (e.g., C60) | 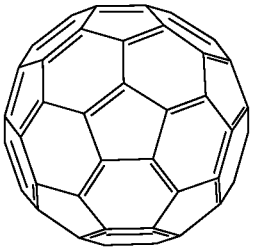 | US20090101870 |
| Triazine complexes | 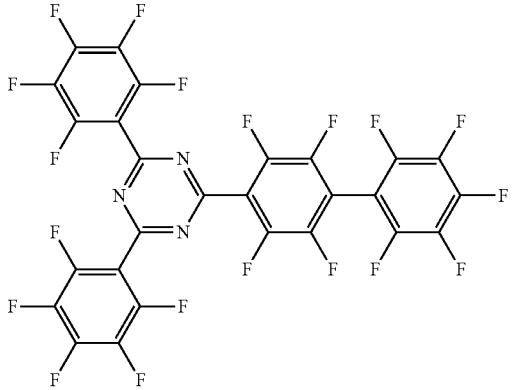 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |

TABLE 2-continued

| MATERIAL | EXAMPLES OF MATERIAL | PUBLICATIONS |
|---|---|---|
| Zn (N^N) complexes | | U.S. Pat. No. 6,528,187 |

EXPERIMENTAL

Chemical abbreviations used throughout this document are as follows: SPhos is dicyclohexyl(2',6'-dimethoxy-[1,1'-biphenyl]-2-yl)phosphine and $Pd_2(dba)_3$ is tri(dibenzylideneacetone)dipalladium(0).

Synthesis of Comp 1

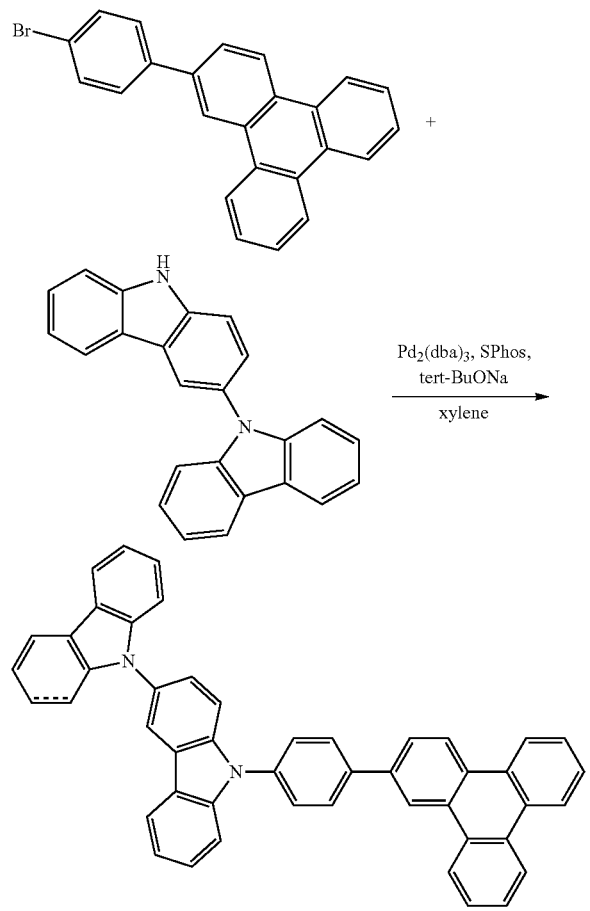

A solution of 2-(4-bromophenyl)triphenylene (1.78 g, 4.64 mmol), 9H-3,9'-bicarbazole (1.70 g, 5.11 mmol), $Pd_2(dba)_3$ (0.17 g, 0.19 mmol), SPhos (0.15 g, 0.37 mmol), and sodium tert-butoxide (1.34 g, 13.93 mmol) in xylene (150 ml) was refluxed overnight. The hot reaction mixture was filtered through a plug of silica gel and the solvent was evaporated. The crude product was purified by precipitation in heptane to yield Comp 1 (2.60 g, 88%) as a white solid.

Device Examples

All devices were fabricated by high vacuum (~$10^{-7}$ Torr) thermal evaporation. The anode electrode was 120 nm of indium tin oxide (ITO). The cathode electrode consisted of 1 nm of LiF followed by 100 nm of Al. All devices were encapsulated with a glass lid sealed with an epoxy resin in a nitrogen glove box (<1 ppm of $H_2O$ and $O_2$) immediately after fabrication, and a moisture getter was incorporated inside the package.

All device examples had organic stacks consisting of, sequentially, from the ITO surface, 10 nm of Compound A as the hole injection layer (HIL), 30 nm of 4,4'-bis[N-(1-naphthyl)-N-phenylaminolbiphenyl (NPD) as the hole-transport layer (HTL), and 30 nm of inventive hosts (Comp 1) or comparative hosts (CC-1, CC-2, and CC-3) doped with 15 wt % of Compound A as the emissive layer (EML). On top of the EML, 5 nm of Compound BL was deposited as the hole blocking layer (HBL), followed by 45 nm of tris(8-hydroxyquinolinato)aluminum ($Alq_3$) as the electron-transport layer (ETL).

The chemical structures of the compounds used in the devices are as follows:

Compound A

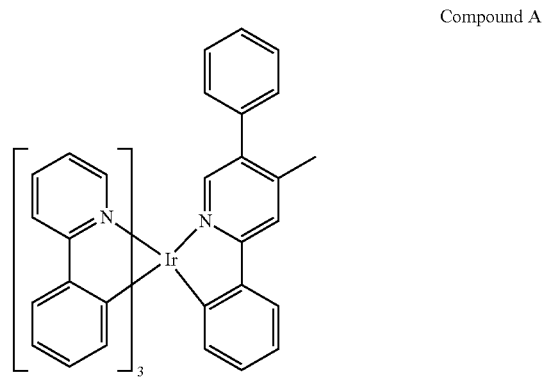

-continued

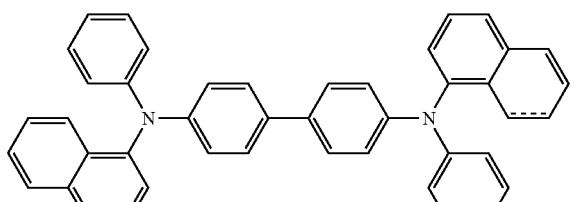

NPD

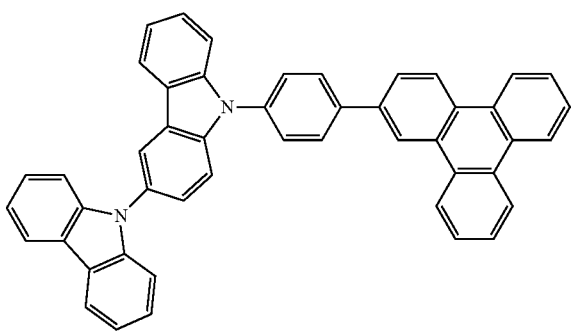

CC-1

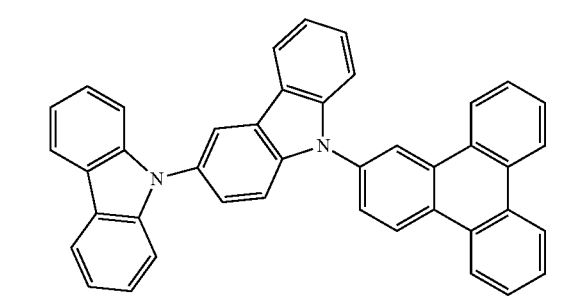

CC-2

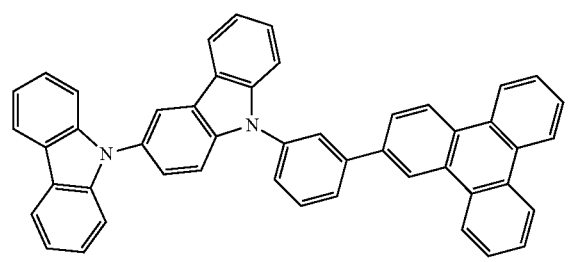

CC-3

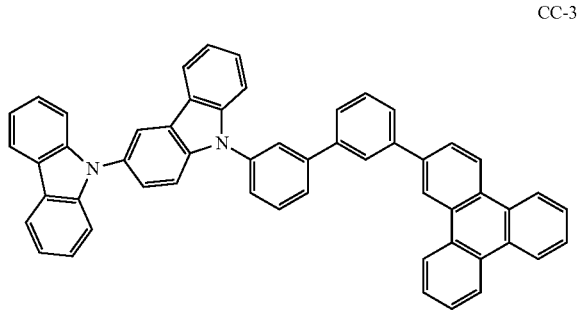

-continued

Compound BL

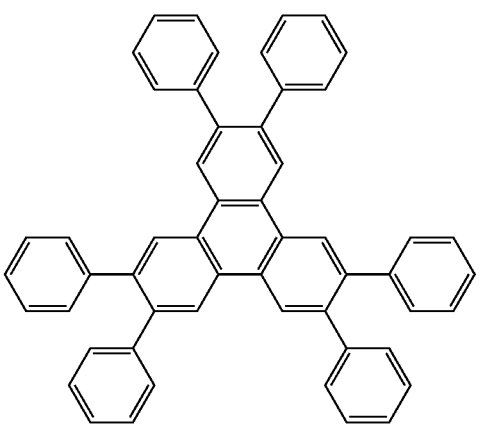

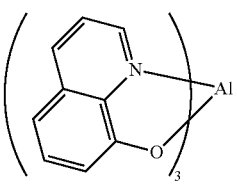

Alq3

Thermal Properties of Compounds

The glass transition temperatures ($T_g$) of selected compounds were measured using differential scanning calorimetery (DSC) during a heating scan at 10° C./min and the results are recorded in TABLE 3.

TABLE 3

Glass Transition Temperatures of Compounds.

| Compound | $T_g$, ° C. |
|---|---|
| CC-1 | 154 |
| CC-2 | 155 |
| CC-3 | 158 |
| Comp 1 | 160 |

Unexpectedly, Comp 1 has a higher $T_g$ than comparative examples CC-1, CC-2, and CC-3, suggesting that the inventive chemical structure is favorable for a high $T_g$. It is worth noting that Comp 1 has a molecular weight less than CC-3. On the other hand, it is widely accepted that, used at the same temperature, organic materials with high $T_g$ are less prone to undergo phase transition, e.g. crystallization. Therefore, the inventive compound is more suitable than the comparative counterparts to build OLEDs operable in a higher-temperature environment.

Device Performance

TABLE 4 provides a summary of the relative device data, where emission color, external quantum efficiency (EQE) was recorded at 1000 nits, while the lifetime ($LT_{80\%}$) defined as the time required for the device to decay to 80% of its initial luminance was measured at a constant current density of 40 mA/cm². All device data are normalized on those of comparative Device C-1.

TABLE 4

| Devices | Host | Color | EQE at 1000 nits | LT$_{80\%}$ at 40 mA/cm² |
|---|---|---|---|---|
| Device C-1 | CC-1 | Green | 100 | 100 |
| Device C-2 | CC-2 | Green | 113 | 149 |
| Device C-3 | CC-3 | Green | 99 | 143 |
| Device 1 | Comp 1 | Green | 112 | 240 |

All devices emit green color. As shown in TABLE 4, Device 1 which uses inventive Comp 1 as host material shows equivalent or better efficiency, and significantly improved lifetime, as compared to devices C-1, C-2, and C-3 using comparative compounds as hosts. This enhanced device performance might be attributable to improved charge balance and materials stability (e.g., higher glass transition temperature), owing to the unique chemical structures of the invented compounds, which is unexpected.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A compound having the formula:

A-L-C (I);

wherein A has the formula:

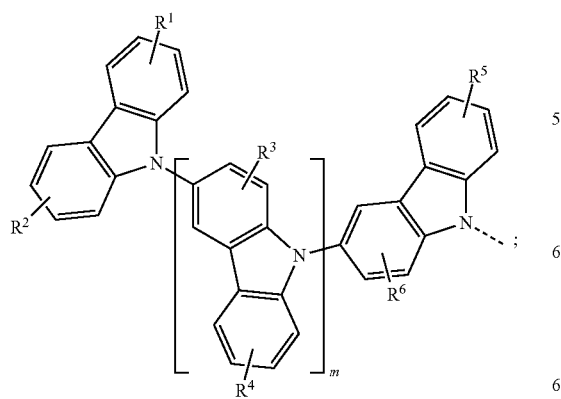

(II)

wherein C has the formula:

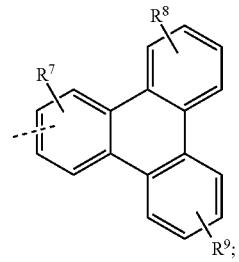

(III)

wherein L has the formula:

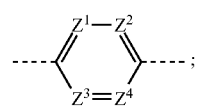

(IV)

wherein R¹, R², R⁴, R⁵, R⁸ and R⁹ each independently represent mono, di, tri, tetra substitutions, or no substitution;
wherein R³, R⁶ and R⁷ each independently represent mono, di, tri substitutions, or no substitution;
wherein m is 0;
wherein R¹, R², R³, R⁴, R⁵, R⁶, R⁷, R⁸ and R⁹ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and
wherein Z¹, Z², Z³ and Z⁴ are each independently selected from the group consisting of N, CH and CD.

2. The compound of claim 1, wherein R¹, R², R³, R⁴, R⁵, R⁶, R⁷, R⁸ and R⁹ are each independently selected from the group consisting of hydrogen, deuterium, aryl, heteroaryl, and combinations thereof.

3. The compound of claim 1, wherein R¹, R², R³, R⁴, R⁵, R⁶, R⁷, R⁸ and R⁹ are each independently selected from the group consisting of hydrogen, deuterium, phenyl, and combinations thereof.

4. The compound of claim 1, wherein R¹, R², R³, R⁴, R⁵, and R⁶ are hydrogen.

5. The compound of claim 1, wherein L is selected from the group consisting of phenyl and pyridine.

6. The compound of claim 1, wherein L is selected from the group consisting of:

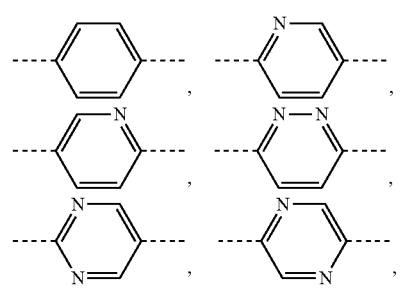

-continued
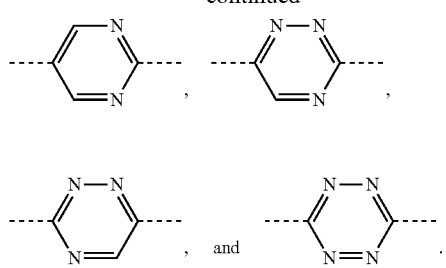
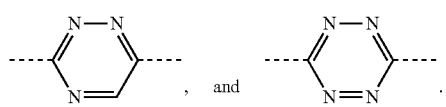, and
7. The compound of claim 1, wherein A is selected from the group consisting of:
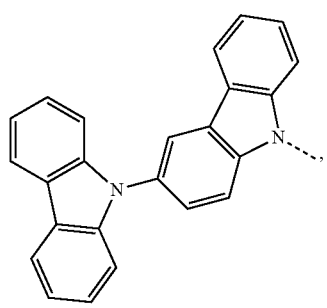
A1
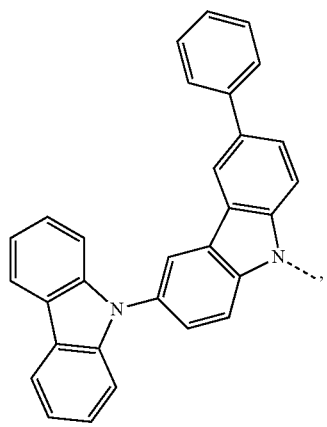
A2
A3
-continued
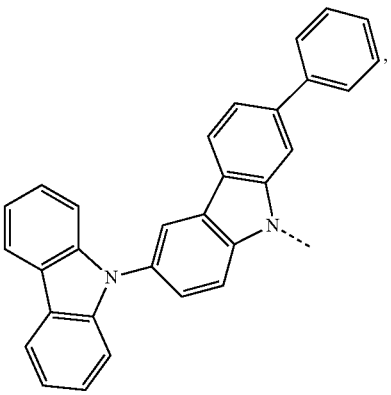
A4
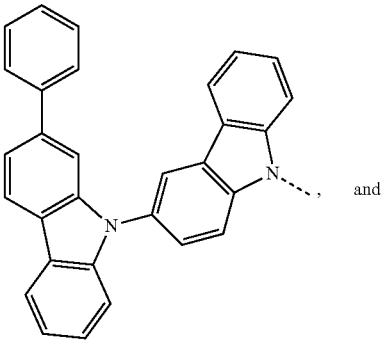
A5, and
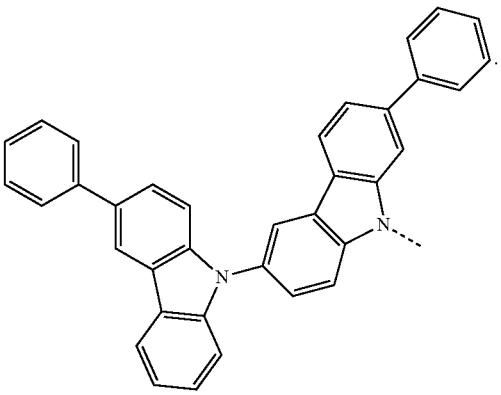
A10
8. The compound of claim 1, wherein A is selected from the group consisting of:
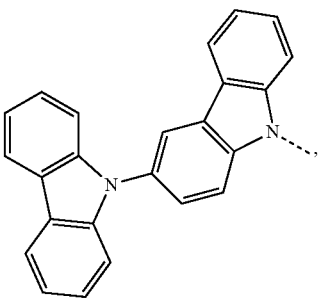
A1
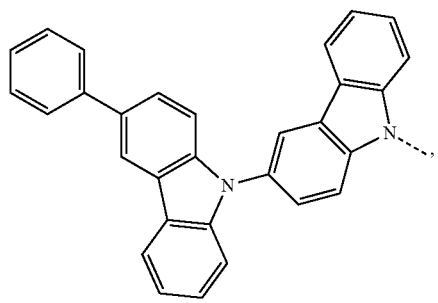

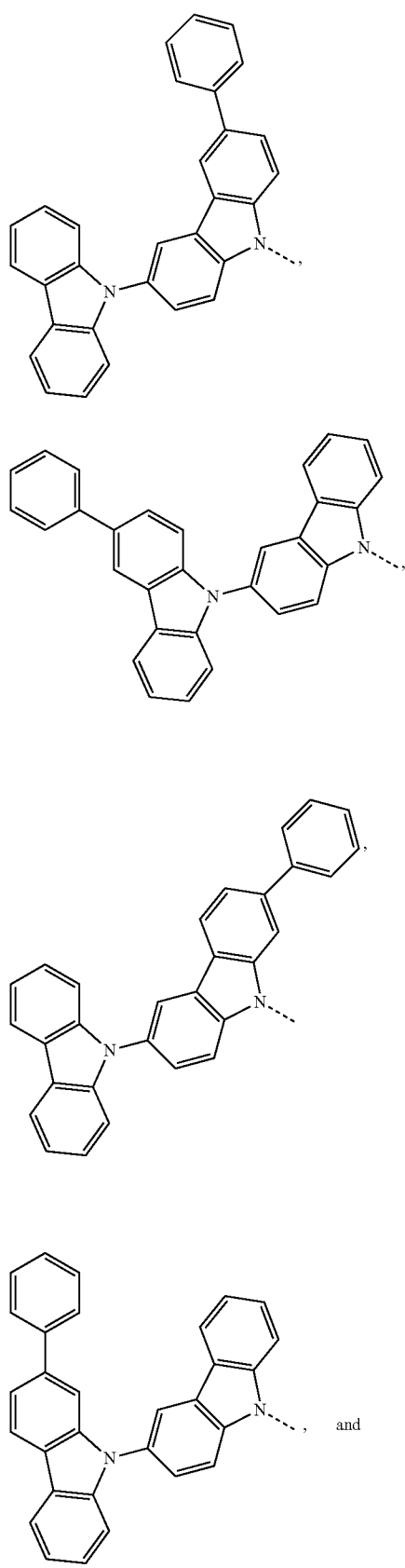
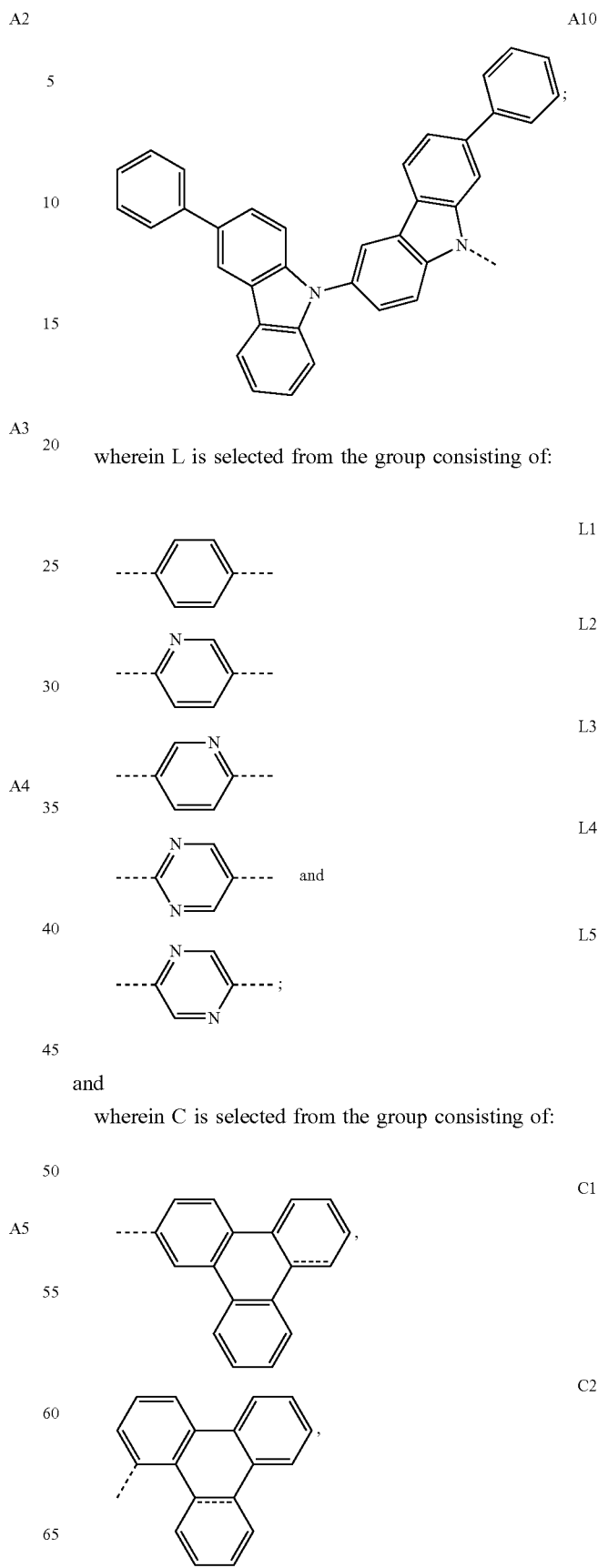
wherein L is selected from the group consisting of:
L1, L2, L3, L4 and L5;
and
wherein C is selected from the group consisting of:
C1, C2,

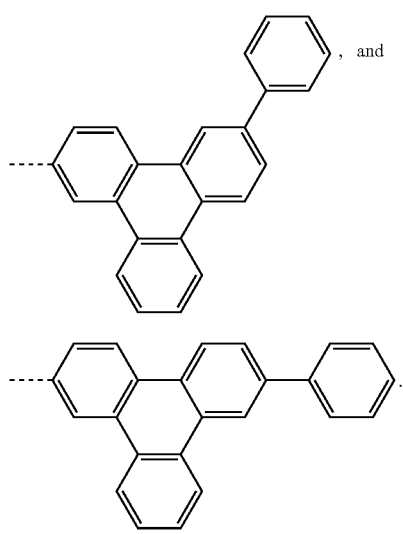

C3, and

C4

9. The compound of claim 8, wherein the compound is selected from the group consisting of Compound 1 to Compound 5, Compound 10 to Compound 15, Compound 20 to Compound 25, Compound 30 to Compound 35, Compound 40 to Compound 45, Compound 50 to Compound 55, Compound 60 to Compound 65, Compound 70 to Compound 75, Compound 80 to Compound 85, Compound 90 to Compound 95, Compound 100 to Compound 105, Compound 110 to Compound 115, Compound 120 to Compound 125, Compound 130 to Compound 135, Compound 140 to Compound 145, Compound 150 to Compound 155, Compound 160 to Compound 165, Compound 170 to Compound 175, Compound 180 to Compound 185, Compound 190 to Compound 195, and Compound 200 listed below:

| Comp # | A | L | C |
| --- | --- | --- | --- |
| Comp 1 | A1 | L1 | C1 |
| Comp 2 | A2 | L1 | C1 |
| Comp 3 | A3 | L1 | C1 |
| Comp 4 | A4 | L1 | C1 |
| Comp 5 | A5 | L1 | C1 |
| Comp 10 | A10 | L1 | C1 |
| Comp 11 | A1 | L2 | C1 |
| Comp 12 | A2 | L2 | C1 |
| Comp 13 | A3 | L2 | C1 |
| Comp 14 | A4 | L2 | C1 |
| Comp 15 | A5 | L2 | C1 |
| Comp 20 | A10 | L2 | C1 |
| Comp 21 | A1 | L3 | C1 |
| Comp 22 | A2 | L3 | C1 |
| Comp 23 | A3 | L3 | C1 |
| Comp 24 | A4 | L3 | C1 |
| Comp 25 | A5 | L3 | C1 |
| Comp 30 | A10 | L3 | C1 |
| Comp 31 | A1 | L4 | C1 |
| Comp 32 | A2 | L4 | C1 |
| Comp 33 | A3 | L4 | C1 |
| Comp 34 | A4 | L4 | C1 |
| Comp 35 | A5 | L4 | C1 |
| Comp 40 | A10 | L4 | C1 |
| Comp 41 | A1 | L5 | C1 |
| Comp 42 | A2 | L5 | C1 |
| Comp 43 | A3 | L5 | C1 |
| Comp 44 | A4 | L5 | C1 |
| Comp 45 | A5 | L5 | C1 |
| Comp 50 | A10 | L5 | C1 |
| Comp 51 | A1 | L1 | C2 |
| Comp 52 | A2 | L1 | C2 |
| Comp 53 | A3 | L1 | C2 |
| Comp 54 | A4 | L1 | C2 |
| Comp 55 | A5 | L1 | C2 |
| Comp 60 | A10 | L1 | C2 |
| Comp 61 | A1 | L2 | C2 |
| Comp 62 | A2 | L2 | C2 |
| Comp 63 | A3 | L2 | C2 |
| Comp 64 | A4 | L2 | C2 |
| Comp 65 | A5 | L2 | C2 |
| Comp 70 | A10 | L2 | C2 |
| Comp 71 | A1 | L3 | C2 |
| Comp 72 | A2 | L3 | C2 |
| Comp 73 | A3 | L3 | C2 |
| Comp 74 | A4 | L3 | C2 |
| Comp 75 | A5 | L3 | C2 |
| Comp 80 | A10 | L3 | C2 |
| Comp 81 | A1 | L4 | C2 |
| Comp 82 | A2 | L4 | C2 |
| Comp 83 | A3 | L4 | C2 |
| Comp 84 | A4 | L4 | C2 |
| Comp 85 | A5 | L4 | C2 |
| Comp 90 | A10 | L4 | C2 |
| Comp 91 | A1 | L5 | C2 |
| Comp 92 | A2 | L5 | C2 |
| Comp 93 | A3 | L5 | C2 |
| Comp 94 | A4 | L5 | C2 |
| Comp 95 | A5 | L5 | C2 |
| Comp 100 | A10 | L5 | C2 |
| Comp 101 | A1 | L1 | C3 |
| Comp 102 | A2 | L1 | C3 |
| Comp 103 | A3 | Li | C3 |
| Comp 104 | A4 | L1 | C3 |
| Comp 105 | A5 | L1 | C3 |
| Comp 110 | A10 | L1 | C3 |
| Comp 111 | A1 | L2 | C3 |
| Comp 112 | A2 | L2 | C3 |
| Comp 113 | A3 | L2 | C3 |
| Comp 114 | A4 | L2 | C3 |
| Comp 115 | A5 | L2 | C3 |
| Comp 120 | A10 | L2 | C3 |
| Comp 121 | A1 | L3 | C3 |
| Comp 122 | A2 | L3 | C3 |
| Comp 123 | A3 | L3 | C3 |
| Comp 124 | A4 | L3 | C3 |
| Comp 125 | A5 | L3 | C3 |
| Comp 130 | A10 | L3 | C3 |
| Comp 131 | A1 | L4 | C3 |
| Comp 132 | A2 | L4 | C3 |
| Comp 133 | A3 | L4 | C3 |
| Comp 134 | A4 | L4 | C3 |
| Comp 135 | A5 | L4 | C3 |
| Comp 140 | A10 | L4 | C3 |
| Comp 141 | A1 | L5 | C3 |
| Comp 142 | A2 | L5 | C3 |
| Comp 143 | A3 | L5 | C3 |
| Comp 144 | A4 | L5 | C3 |
| Comp 145 | A5 | L5 | C3 |
| Comp 150 | A10 | L5 | C3 |
| Comp 151 | A1 | L1 | C4 |
| Comp 152 | A2 | L1 | C4 |
| Comp 153 | A3 | L1 | C4 |
| Comp 154 | A4 | L1 | C4 |
| Comp 155 | A5 | L1 | C4 |
| Comp 160 | A10 | L1 | C4 |
| Comp 161 | A1 | L2 | C4 |
| Comp 162 | A2 | L2 | C4 |
| Comp 163 | A3 | L2 | C4 |
| Comp 164 | A4 | L2 | C4 |
| Comp 165 | A5 | L2 | C4 |
| Comp 170 | A10 | L2 | C4 |
| Comp 171 | A1 | L3 | C4 |
| Comp 172 | A2 | L3 | C4 |
| Comp 173 | A3 | L3 | C4 |
| Comp 174 | A4 | L3 | C4 |
| Comp 175 | A5 | L3 | C4 |
| Comp 180 | A1 | L3 | C4 |

-continued

| Comp # | A | L | C |
|---|---|---|---|
| Comp 181 | A1 | L4 | C4 |
| Comp 182 | A2 | L4 | C4 |
| Comp 183 | A3 | L4 | C4 |
| Comp 184 | A4 | L4 | C4 |
| Comp 185 | A5 | L4 | C4 |
| Comp 190 | A10 | L4 | C4 |
| Comp 191 | A1 | L5 | C4 |
| Comp 192 | A2 | L5 | C4 |
| Comp 193 | A3 | L5 | C4 |
| Comp 194 | A4 | L5 | C4 |
| Comp 195 | A5 | L5 | C4 |
| Comp 200 | A10 | L5 | C4. |

10. The compound of claim 1, wherein the compound has the formula:

Comp 1

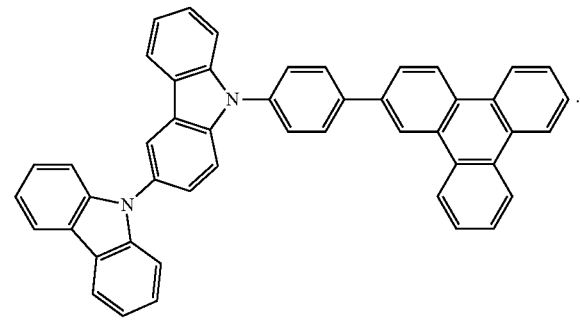

11. A first device comprising a first organic light emitting device, the first organic light emitting device comprising:

an anode;

a cathode; and an organic layer, disposed between the anode and the cathode, comprising a compound having the formula:

A-L-C      (I);

wherein A has the formula:

(II)

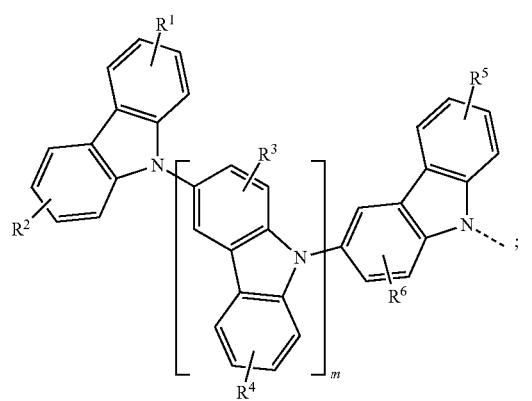

wherein C has the formula:

(III)

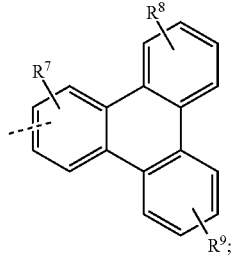

wherein L has the formula:

(IV)

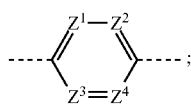

wherein $R^1$, $R^2$, $R^4$, $R^5$, $R^8$ and $R^9$ each independently represent mono, di, tri, tetra substitutions, or no substitution;

wherein $R^3$, $R^6$ and $R^7$ each independently represent mono, di, tri substitutions, or no substitution;

wherein m is 0;

wherein $R^1$, $R^2$, $R^3$, $R^4$, $R^5$, $R^6$, $R^7$, $R^8$ and $R^9$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and wherein $Z^1$, $Z^2$, $Z^3$ and $Z^4$ are each independently selected from the group consisting of N, CH and CD.

12. The first device of claim 11, wherein the organic layer is an emissive layer and the compound of the formula I is a host.

13. The first device of claim 11, wherein the organic layer further comprises a phosphorescent emissive dopant.

14. The first device of claim 13, wherein the phosphorescent emissive dopant is a transition metal complex having at least one ligand or part of the ligand if the ligand is more than bidentate selected from the group consisting of:

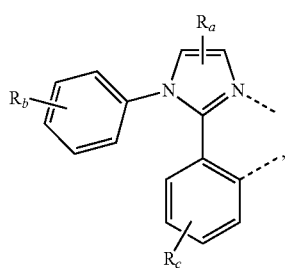

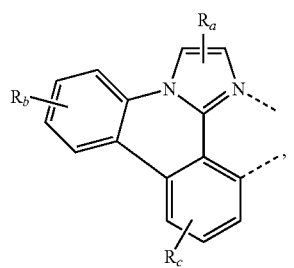
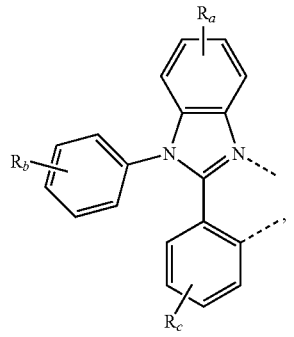
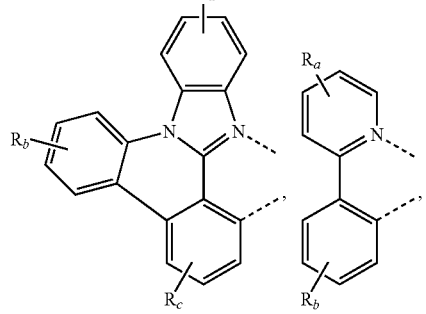
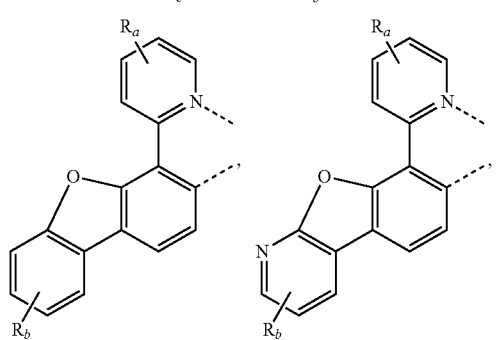
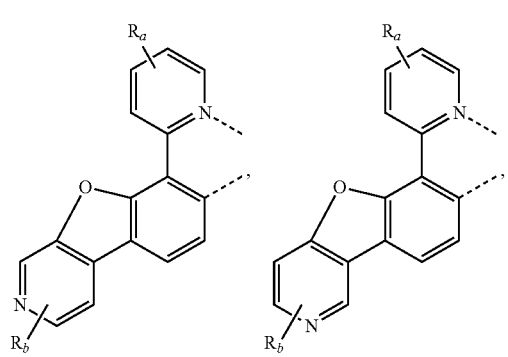
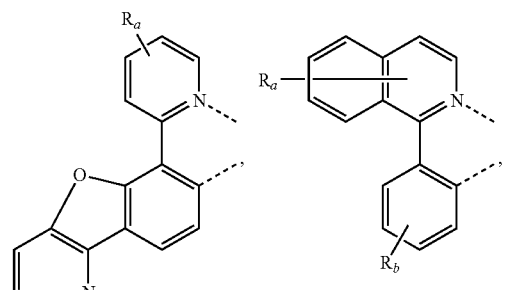
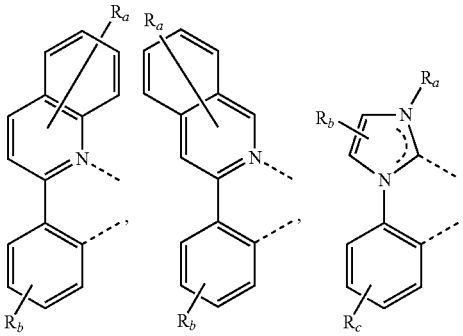
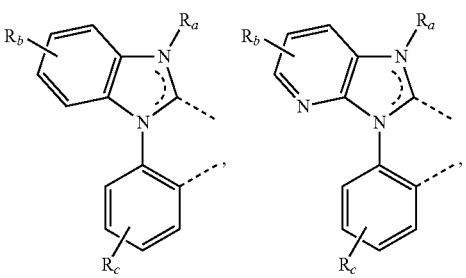
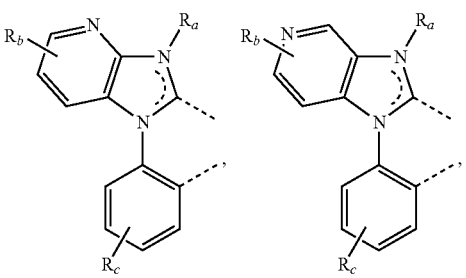
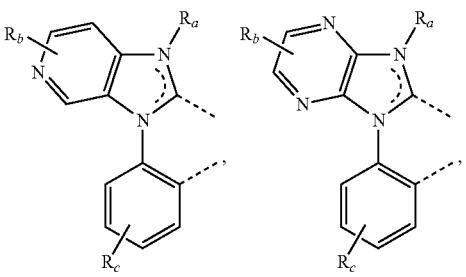

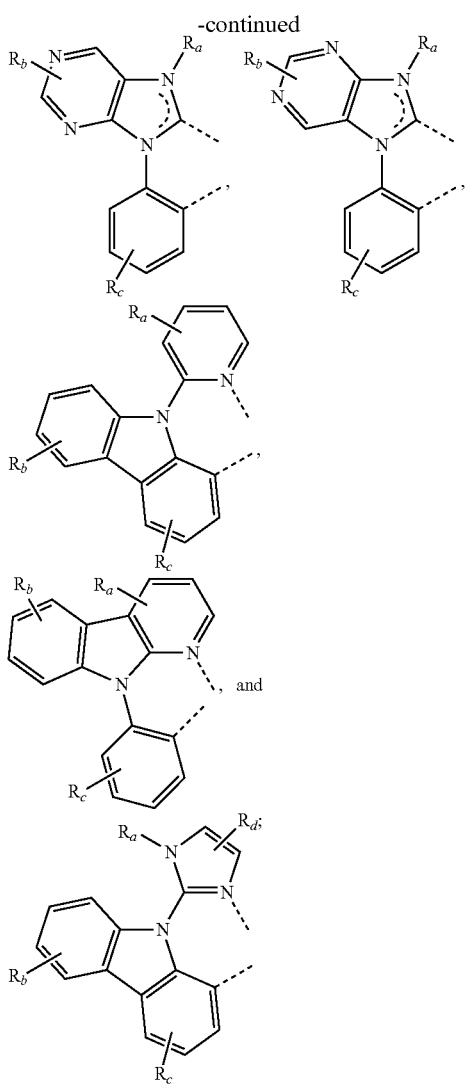

wherein $R_a$, $R_b$, $R_c$, and $R_d$ may represent mono, di, tri, or tetra substitution, or no substitution;

wherein $R_a$, $R_b$, $R_c$, and $R_d$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R_a$, $R_b$, $R_c$, and $R_d$ are optionally joined to form a fused ring or form a multidentate ligand.

15. The first device of claim 11, wherein the organic layer is a blocking layer and the compound of formula I is a blocking material in the organic layer.

16. The first device of claim 11, wherein the first device is a consumer product.

17. The first device of claim 11, wherein the first device is an organic light-emitting device.

18. The first device of claim 11, wherein the first device comprises a lighting panel.

19. The first device of claim 11, wherein the compound of formula I is:

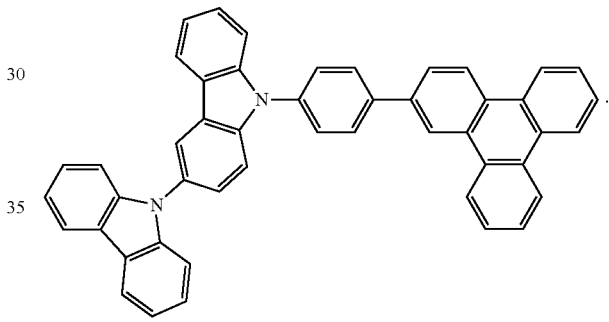

Comp 1

20. A formulation comprising the compound of claim 1.

* * * * *

UNITED STATES PATENT AND TRADEMARK OFFICE
CERTIFICATE OF CORRECTION

PATENT NO. : 9,876,173 B2  
APPLICATION NO. : 14/100767  
DATED : January 23, 2018  
INVENTOR(S) : Lichang Zeng et al.

Page 1 of 1

It is certified that error appears in the above-identified patent and that said Letters Patent is hereby corrected as shown below:

In the Specification

Column 20, Line 61, please delete second instance of the word "sulfanyl" and insert --sulfinyl--.

Column 21, Line 40, please delete the word "deterium" and insert --deuterium--.

Column 37, Line 30, please delete the word "nitrite" and insert --nitrile--.

Column 43, Line 23, following the word ligand, please insert --$Y^{101}$--.

Column 43, Line 62, following the word ligand, please insert --$Y^{103}$--.

Signed and Sealed this  
Fifteenth Day of May, 2018

Andrei Iancu  
*Director of the United States Patent and Trademark Office*